(12) United States Patent
Wang et al.

(10) Patent No.: US 11,567,413 B2
(45) Date of Patent: Jan. 31, 2023

(54) METHOD FOR DETERMINING STOCHASTIC VARIATION OF PRINTED PATTERNS

(71) Applicant: ASML NETHERLANDS B.V., Veldhoven (NL)

(72) Inventors: Chang An Wang, Poughkeepsie, NY (US); Alvin Jianjiang Wang, Fremont, CA (US); Jiao Liang, San Jose, CA (US); Jen-Shiang Wang, Sunnyvale, CA (US); Mu Feng, San Jose, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 17/430,517

(22) PCT Filed: Jan. 30, 2020

(86) PCT No.: PCT/EP2020/052261
§ 371 (c)(1),
(2) Date: Aug. 12, 2021

(87) PCT Pub. No.: WO2020/173654
PCT Pub. Date: Sep. 3, 2020

(65) Prior Publication Data
US 2022/0137514 A1 May 5, 2022

Related U.S. Application Data

(60) Provisional application No. 62/809,838, filed on Feb. 25, 2019.

(51) Int. Cl.
*G03F 7/20* (2006.01)
(52) U.S. Cl.
CPC .......... *G03F 7/705* (2013.01); *G03F 7/70625* (2013.01)

(58) Field of Classification Search
CPC ................. G03F 7/705; G03F 7/70625; G06T 2207/10016; G06T 2207/10061;
(Continued)

(56) References Cited

U.S. PATENT DOCUMENTS

| 5,229,872 A | 7/1993 | Mumola |
| 5,296,891 A | 3/1994 | Vogt et al. |

(Continued)

FOREIGN PATENT DOCUMENTS

| CN | 108257166 | 7/2018 |
| CN | 109872287 | 6/2019 |

(Continued)

OTHER PUBLICATIONS

International Search Report and Written Opinion issued in corresponding PCT Patent Application No. PCT/EP2020/052261, dated Jun. 3, 2020.

(Continued)

*Primary Examiner* — Deoram Persaud
(74) *Attorney, Agent, or Firm* — Pillsbury Winthrop Shaw Pittman LLP

(57) ABSTRACT

A method for determining measurement data of a printed pattern on a substrate. The method involves obtaining (i) images of the substrate including a printed pattern corresponding to a reference pattern, (ii) an averaged image of the images, and (iii) a composite contour based on the averaged image. Further, the composite contour is aligned with respect to a reference contour of the reference pattern and contours are extracted from the images based on both the aligned composite contour and the output of die-to-database alignment of the composite contour. Further, the method determines a plurality of pattern measurements based on the contours and the measurement data corresponding to the printed patterns based on the plurality of the pattern mea- (Continued)

surements. Further, the method determines a one or more process variations such as stochastic variation, inter-die variation, intra-die variation and/or total variation.

20 Claims, 29 Drawing Sheets

(58) Field of Classification Search
CPC . G06T 2207/20216; G06T 2207/30148; G06T 7/001; G06T 7/13; G06T 7/181
See application file for complete search history.

(56) References Cited

U.S. PATENT DOCUMENTS

| | | | |
|---|---|---|---|
| 5,523,193 | A | 6/1996 | Nelson |
| 5,969,441 | A | 10/1999 | Loopstra et al. |
| 6,046,792 | A | 4/2000 | Van Der Werf et al. |
| 7,003,758 | B2 | 2/2006 | Ye et al. |
| 7,587,704 | B2 | 9/2009 | Ye et al. |
| 7,694,267 | B1 | 4/2010 | Ye et al. |
| 8,200,468 | B2 | 6/2012 | Ye et al. |
| 9,852,884 | B2 * | 12/2017 | Tsunoda ............. H01J 37/3174 |
| 10,025,885 | B2 | 7/2018 | Ye et al. |
| 11,422,473 | B2 * | 8/2022 | Liang ................ G03F 7/70283 |
| 2009/0202139 | A1 | 8/2009 | Toyoda et al. |
| 2010/0315614 | A1 | 12/2010 | Hansen |
| 2012/0070089 | A1 | 3/2012 | Yamada et al. |
| 2013/0271595 | A1 | 10/2013 | Hiroi et al. |
| 2014/0003703 | A1 * | 1/2014 | Shibahara ............... G06T 7/136 382/145 |
| 2015/0146966 | A1 | 5/2015 | Weisbuch |
| 2015/0371377 | A1 | 12/2015 | Hsueh et al. |
| 2016/0283617 | A1 | 9/2016 | Bailey et al. |
| 2017/0336713 | A1 | 11/2017 | Middlebrooks et al. |
| 2017/0345138 | A1 | 11/2017 | Middlebrooks et al. |
| 2018/0275521 | A1 | 9/2018 | Wallow et al. |
| 2019/0049858 | A1 | 2/2019 | Gurevich et al. |
| 2019/0107781 | A1 | 4/2019 | Tinnemans et al. |
| 2019/0310553 | A1 | 10/2019 | Jochemsen et al. |
| 2021/0405538 | A1 * | 12/2021 | Hansen ................ G06F 30/367 |

FOREIGN PATENT DOCUMENTS

| | | |
|---|---|---|
| TW | 201812474 | 4/2018 |
| WO | 2010059954 | 5/2010 |
| WO | 2016202546 | 12/2016 |
| WO | 2018160502 | 9/2018 |
| WO | 2019233711 | 12/2019 |

OTHER PUBLICATIONS

Taiwanese Office Action issued in corresponding Taiwanese Patent Application No. 109105796, dated Feb. 26, 2021.
Spence, C.: "Full-Chip Lithography Simulation and Design Analysis—How OPC Is Changing IC Design", Proc. of SPIE, vol. 5751, pp. 1-14 (2005).
Cao, Y. et al.: "Optimized Hardware and Software For Fast, Full Chip Simulation", Proc. of SPIE, vol. 5754 (2005).
Rosenbluth, A.E. et al.: "Optimum Mask and Source Patterns to Print A Given Shape", Journal of Microlithography, Microfabrication, Microsystems 1(1), pp. 13-20 (2002).
Granik, Y.: "Source Optimization for Image Fidelity and Throughput", Journal of Microlithography, Microfabrication, Microsystems 3(4), pp. 509-522 (Oct. 2004).
Socha, R. et. al.: "Simultaneous Source Mask Optimization (SMO)", Proc. of SPIE, vol. 5853 (2005).

* cited by examiner

METHOD FOR DETERMINING STOCHASTIC VARIATION OF PRINTED PATTERNS

CROSS-REFERENCE TO RELATED APPLICATIONS

This application is the U.S. national phase entry of PCT Patent Application No. PCT/EP2020/052261 which was filed on Jan. 30, 2020, which claims the benefit of priority of U.S. Patent Application No. 62/809,838 which was filed on Feb. 25, 2019 and which is incorporated herein in its entirety by reference.

TECHNICAL FIELD

The description herein relates to lithographic apparatuses and processes, and more particularly to a tool to determine stochastic variations in printed patterns e.g., in resist layer on a wafer which can be used to model stochastic variation for process variation prediction and defect detection, detect defects on a wafer and optimize a patterning process such as a mask optimization and a source optimization.

BACKGROUND

A lithographic projection apparatus can be used, for example, in the manufacture of integrated circuits (ICs). In such a case, a patterning device (e.g., a mask) may contain or provide a circuit pattern corresponding to an individual layer of the IC ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithographic projection apparatus, one target portion at a time. In one type of lithographic projection apparatuses, the circuit pattern on the entire patterning device is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithographic projection apparatus will have a magnification factor M (generally <1), the speed F at which the substrate is moved will be a factor M times that at which the projection beam scans the patterning device. More information with regard to lithographic devices as described herein can be gleaned, for example, from U.S. Pat. No. 6,046,792, incorporated herein by reference.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, microlithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet (DUV) or extreme-ultraviolet (EUV) illumination source, creating individual functional elements having dimensions well below 100 nm, i.e. less than half the wavelength of the radiation from the illumination source (e.g., a 193 nm DUV and 13.5 nm EUV illumination source).

This process in which features with dimensions smaller than the classical resolution limit of a lithographic projection apparatus are printed, is commonly known as low-$k_1$ lithography, according to the resolution formula $CD=k_1\times\lambda/NA$, where $\lambda$ is the wavelength of radiation employed (currently in most cases 248 nm or 193 nm or 13.5 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic projection apparatus and/or design layout. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

BRIEF SUMMARY

In an embodiment, there is a provided method for determining stochastic variation of measurement data of a printed pattern on a substrate. The method involves obtaining (i) a plurality of images of the substrate, each of the images comprising a printed pattern corresponding to a reference pattern, (ii) an averaged image of the plurality of images, and (iii) a composite contour of the printed patterns based on the averaged image; aligning, via a processor, the composite contour of the averaged image with respect to a reference contour of the reference pattern; extracting, via the processor, from the plurality of raw images the contours of the printed patterns within the images, the extracting being based on the aligned averaged contour; determining, via the processor, a plurality of pattern measurements based on the plurality of raw contours, wherein pattern measurements are characteristics of both the printed patterns and patterning process; and determining, via the processor, the measurement data corresponding to the printed patterns based on the plurality of the pattern measurements. Further, the method determines a plurality of process variations such as stochastic variation, inter-die variation, intra-die variation and total variation.

Furthermore, in an embodiment, there is provided an apparatus configured to extract a contour from a metrology image. The apparatus comprising a processor configured to: obtain (i) the metrology image of a substrate having a printed pattern, (ii) an averaged image of the printed pattern, (iii) composite contour from the averaged image, (iv) aligned composite contour with respect to a reference contour of a reference pattern, (v) raw contours from the metrology images, and (vi) a measurement statistic corresponding to the printed pattern based on the raw contours.

Furthermore, in an embodiment, there is provided a computer program product comprising a non-transitory computer readable medium having instructions recorded thereon, the instructions when executed by a computer system implementing the aforementioned method.

BRIEF DESCRIPTION OF THE DRAWINGS

Embodiments will now be described, by way of example only, with reference to the accompanying drawings in which.

Figure 1:
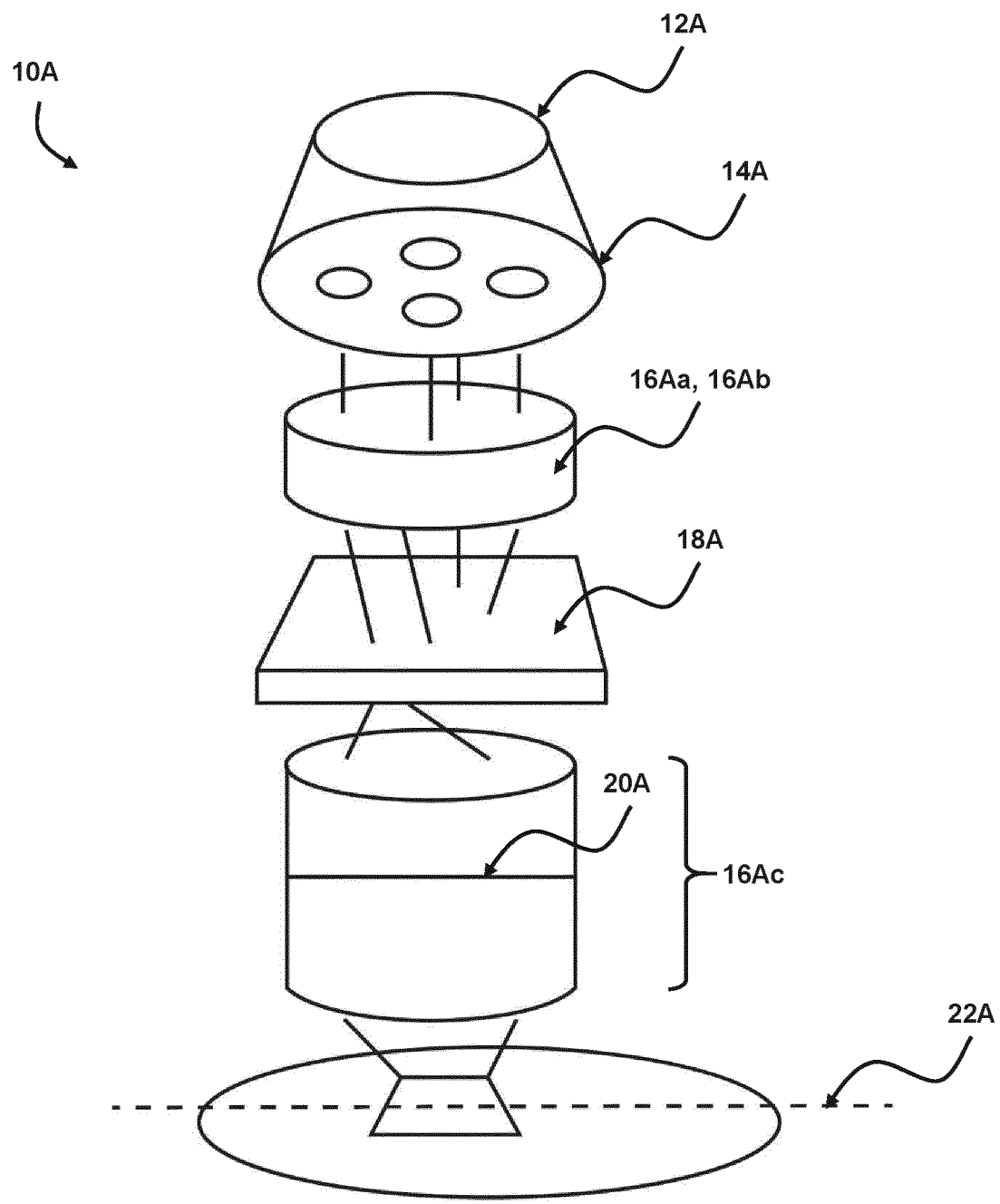
FIG. 1 is a block diagram of various subsystems of a lithography system, according to an embodiment.

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

DETAILED DESCRIPTION

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein mean adjusting a lithographic projection apparatus such that results and/or processes of lithography have more desirable characteristics, such as higher accuracy of projection of design layouts on a substrate, larger process windows, etc.

Further, the lithographic projection apparatus may be of a type having two or more substrate tables (and/or two or more patterning device tables). In such "multiple stage" devices the additional tables may be used in parallel, or preparatory steps may be carried out on one or more tables while one or more other tables are being used for exposures. Twin stage lithographic projection apparatuses are described, for example, in U.S. Pat. No. 5,969,441, incorporated herein by reference.

The patterning device referred to above comprises or can form design layouts. The design layouts can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

a programmable LCD array. An example of such a construction is given in U.S. Pat. No. 5,229,872, which is incorporated herein by reference.

As a brief introduction, FIG. 1 illustrates an exemplary lithographic projection apparatus 10A. Major components are a radiation source 12A, which may be a deep-ultraviolet excimer laser source or other type of source including an extreme ultra violet (EUV) source (as discussed above, the lithographic projection apparatus itself need not have the radiation source), illumination optics which define the partial coherence (denoted as sigma) and which may include optics 14A, 16Aa and 16Ab that shape radiation from the source 12A; a patterning device 14A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=sin ($\Theta_{max}$).

In an optimization process of a system, a figure of merit of the system can be represented as a cost function. The optimization process boils down to a process of finding a set of parameters (design variables) of the system that minimizes the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations (i.e., worst deviation). The term "evaluation points" herein should be interpreted broadly to include any characteristics of the system. The design variables of the system can be confined to finite ranges and/or be interdependent due to practicalities of implementations of the system. In case of a lithographic projection apparatus, the constraints are often associated with physical properties and characteristics of the hardware such as tunable ranges, and/or patterning device manufacturability design rules, and the evaluation points can include physical points on a resist image on a substrate, as well as non-physical characteristics such as dose and focus.

In a lithographic projection apparatus, a source provides illumination (i.e. light); projection optics direct and shapes the illumination via a patterning device and onto a substrate. The term "projection optics" is broadly defined here to include any optical component that may alter the wavefront of the radiation beam. For example, projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in commonly assigned U.S. patent application Ser. No. 12/315,849, disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the patterning device and the projection optics) dictate the aerial image. Since the patterning device used in the lithographic projection apparatus can be changed, it is desirable to separate the optical properties of the patterning device from the optical properties of the rest of the lithographic projection apparatus including at least the source and the projection optics.

Figure 2:
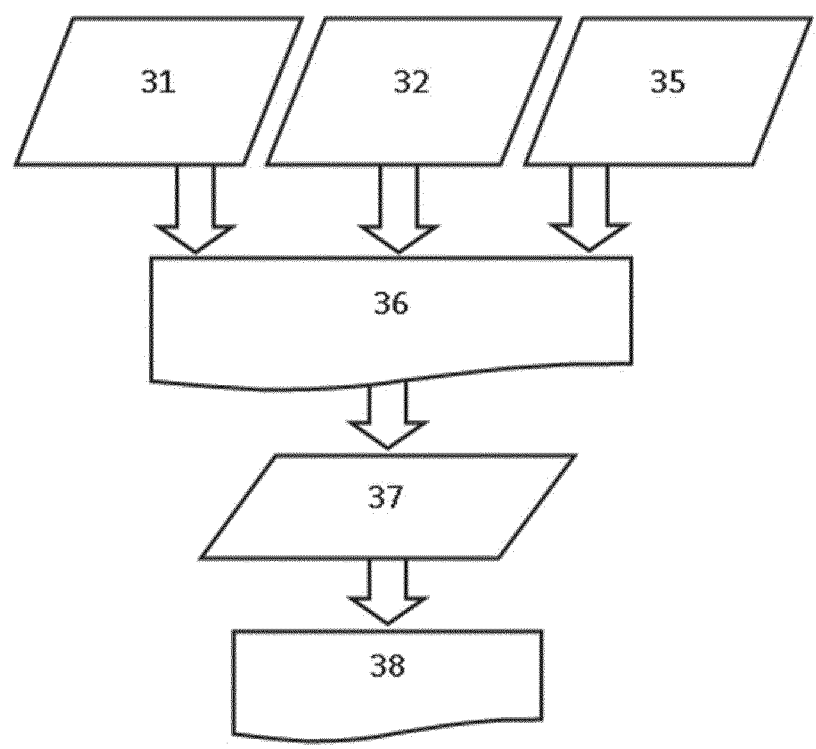
FIG. 2 is a block diagram of simulation models corresponding to the subsystems in FIG. 1, according to an embodiment.

An exemplary flow chart for simulating lithography in a lithographic projection apparatus is illustrated in FIG. 2. A source model 31 represents optical characteristics (including radiation intensity distribution and/or phase distribution) of the source. A projection optics model 32 represents optical characteristics (including changes to the radiation intensity distribution and/or the phase distribution caused by the projection optics) of the projection optics. A design layout model 35 represents optical characteristics (including changes to the radiation intensity distribution and/or the phase distribution caused by a given design layout 33) of a design layout, which is the representation of an arrangement of features on or formed by a patterning device. An aerial image 36 can be simulated from the design layout model 35, the projection optics model 32 and the design layout model 35. A resist image 38 can be simulated from the aerial image 36 using a resist model 37. Simulation of lithography can, for example, predict contours and CDs in the resist image.

More specifically, it is noted that the source model 31 can represent the optical characteristics of the source that include, but not limited to, NA-sigma (σ) settings as well as any particular illumination source shape (e.g. off-axis radiation sources such as annular, quadrupole, and dipole, etc.). The projection optics model 32 can represent the optical characteristics of the of the projection optics that include aberration, distortion, refractive indexes, physical sizes, physical dimensions, etc. The design layout model 35 can also represent physical properties of a physical patterning device, as described, for example, in U.S. Pat. No. 7,587,704, which is incorporated by reference in its entirety. The objective of the simulation is to accurately predict, for example, edge placements, aerial image intensity slopes and CDs, which can then be compared against an intended design. The intended design is generally defined as a pre-OPC design layout which can be provided in a standardized digital file format such as GDSII or OASIS or other file format.

From this design layout, one or more portions may be identified, which are referred to as "clips". In an embodiment, a set of clips is extracted, which represents the complicated patterns in the design layout (typically about 50 to 1000 clips, although any number of clips may be used). As will be appreciated by those skilled in the art, these patterns or clips represent small portions (i.e. circuits, cells or patterns) of the design and especially the clips represent small portions for which particular attention and/or verification is needed. In other words, clips may be the portions of the design layout or may be similar or have a similar behavior of portions of the design layout where critical features are identified either by experience (including clips provided by a customer), by trial and error, or by running a full-chip simulation. Clips usually contain one or more test patterns or gauge patterns.

An initial larger set of clips may be provided a priori by a customer based on known critical feature areas in a design layout which require particular image optimization. Alternatively, in another embodiment, the initial larger set of clips may be extracted from the entire design layout by using some kind of automated (such as, machine vision) or manual algorithm that identifies the critical feature areas.

Stochastic variations of the patterning process (e.g., resist process) potentially limits EUV lithography implementation for semiconductor high volume manufacturing (e.g., HVM) because of the combination of "few" photons per millijoule dose and preferred low dose processes, for example, in terms of shrink potential of features and exposure-dose specification, which in turn affects product yield or wafer throughput of the patterning process or both. In an embodiment, stochastic variations of a resist layer may manifest in different failure modes described by, for example, line width roughness (LWR), line edge roughness (LER), local CD non-uniformity, closed holes or trenches, and/or broken lines at the extreme condition. Such stochastic variations impact and limit successful HVM EUV adoption. In order to characterize, understand and predict stochastic variation, the industry needs a trustworthy method to measure such variation for variety of design patterns not just 1D line space pattern or limited dense contact array pattern.

Existing approaches of measuring stochastic variation involves different measurement techniques for 1-dimensional (1D) and 2-dimensional (2D) patterns, for example, 1D line/space and 2D repeating dense contact array patterns printed on a substrate. Based on such measurements, a performance metric (e.g., stochastic variation) of the pattern process is determined to optimize the patterning process. For example, a 1D pattern measure is a line width roughness (LWR), and a 2D repeating dense contact array measure is local CD uniformity (LCDU).

Currently, there is no unified solution to measure 1D and 2D patterns with the same algorithm. Different SEM algorithms are used in LWR and LCDU measurements. Moreover, there is a significant algorithm difference among different SEM machines. It is difficult to make an apple-to-apple comparison between LWR of 1D line/space and LCDU of 2D repeating dense contact array and estimate SEPE for different patterns accurately. Moreover, there does not exist a method to estimate SEPE for irregular 2D patterns other than 2D repeating dense contact array. Having the unified measurement system, as suggested in present disclosure, allows measurement of the 1D pattern and the 2D pattern with the same algorithm and estimation of SEPE with the same ruler (i.e., same measurement algorithm), thereby improving the measurement consistency, accuracy and efficiency. As the stochastic variations of the 1D and 2D patterns are in the same measurement system, as opposed to different measurement system (e.g., in case of LWR and LCDU), the unified measurements when used during modeling and optimization of patterning process will result in improved modeling and optimization accuracy, e.g., of a patterning recipe, an hot spot identification and prediction, source and mask optimization, or other patterning related processes.

Conventionally, measurements of printed patterns are based on waveforms extracted at gauge locations (e.g., locations at which CD measurements are done) from images (e.g., SEM image) of the printed patterns. The waveforms of the printed pattern are measured by using mathematical algorithms to detect edges on the waveform. A simplest algorithm is thresholding of the image intensity. Such algorithm has been widely used across the metrology industry, especially, in defect and CD metrologies of the semiconductor industry.

A previous application (e.g., in U.S. Application No. 62/680,284, filed on Jun. 4, 2018, incorporated herein by reference in its entirety) provides a contour based metrology for the averaged images. For example, the extraction is based on an accurate Die-to-Die alignment, an average image, and a contour extraction method. The application enables a fast and accurate contour based measurement, e.g., CD and EPE measurements by averaging images to get very high signal-to-noise ratio. Unfortunately, in the image averaging process, the stochastic variation information is lost. The present disclosure provides a more accurate and improved contour extraction method for raw images instead of an averaged image and measurement data of these raw contours (e.g., CD or EPE) to determine the stochastic variation of patterning process. In an embodiment, the concepts of present disclosure are not limited to a particular measurement.

For easy readability, the methods are described with reference to stochastic edge placement error (SEPE) as an example, which is a performance limiter in EUV era. In order to control, reduce and predict SEPE, the semiconductor industry needs a robust, unified & manufacturing-ready solution to measure SEPE accurately. As mentioned earlier, the semiconductor industry does not have a unified solution to measure SEPE for both 1D and 2D with the same algorithm. Currently, the industry measures LWR for 1D line and LCDU for repeating 2D contact array to estimate SEPE. Moreover, these measures only focus on pattern level (e.g., one number per pattern) but not on edge point level (e.g., points along a contour of a pattern) where a hot spot occurs. Therefore, a contour based SEPE metrology method is needed for edge point level stochastic variation measurement.

In order to measure the real edge placement error for each edge point (i.e., a point along a contour of a pattern), an accurate and reliable contour should be extracted from a raw image instead of averaged image of the printed pattern (e.g., a raw SEM image). The industry is struggling to extract such reliable contours from raw SEM images, especially, the preferred low dose SEM images because of the low signal-to-noise ratio of raw SEM images.

Various image de-noise filters are used to improve raw contour quality. Unfortunately, de-noise filtering could distort the characteristics of the image too much to represent a real value of stochastic effects. Contour quality is heavily dependent on image quality or image contrast. If image quality is low, contour quality will be low too. In order to improve contour quality, averaging method is used either by extracting a contour from an averaged image or by averaging the contours extracted from many raw images. For example, an ASML MXP product (a previous application) extracts a contour from the averaged image with very high quality, but a problem of how to extract a high quality contour from a raw image still remains.

The method of present disclosure has several advantages. The method extracts a high quality composite contour from the averaged image of multiple repeating images corresponding to the same design pattern collected at the different locations across a wafer. In an embodiment, the present approach uses the contour extracted reliably from the averaged image as a reference to guide contour extraction from raw images. This improves raw contour quality to obtain more realistic stochastic measurement information by avoiding or reducing, for example, inaccurate contour points for the location where raw image contrast is relatively poor. Moreover, accurate sub-pixel alignment resolution between raw images provides better accuracy in SEPE bandwidth extraction and subsequent statistical data analysis to determine the stochastic variation and other process variation. According to an embodiment, the present disclosure enables capturing the stochastic variation for both 1D and 2D patterns through contour based metrology with the same contour extraction algorithm to provide an unified SEPE metrology solution for the industry. In addition, the present method provides faster, more accurate and contour point specific measurement.

According to an embodiment, the terms "raw image," and "metrology image," refer to an image (e.g., SEM image) of the printed substrate. A raw image may be of a portion (e.g., $1^{st}$ die, $2^{nd}$ die, $3^{rd}$ die, etc. having a desired pattern) of a substrate, an entire printed substrate, or different substrates having a desired pattern. In an embodiment, the image may refer to a desired printed pattern for which measurements are collected and further the measurements are used for different patterning process simulations (e.g., OPC, resist image, mask image, etc.). In an embodiment, the desired pattern refers to any pattern to be printed on a substrate, which when printed may be referred as a desired printed pattern. For example, the desired pattern corresponds to a design pattern such as contact hole, line and any irregular patterns found in a memory, logic or other IC circuits.

Figure 3:
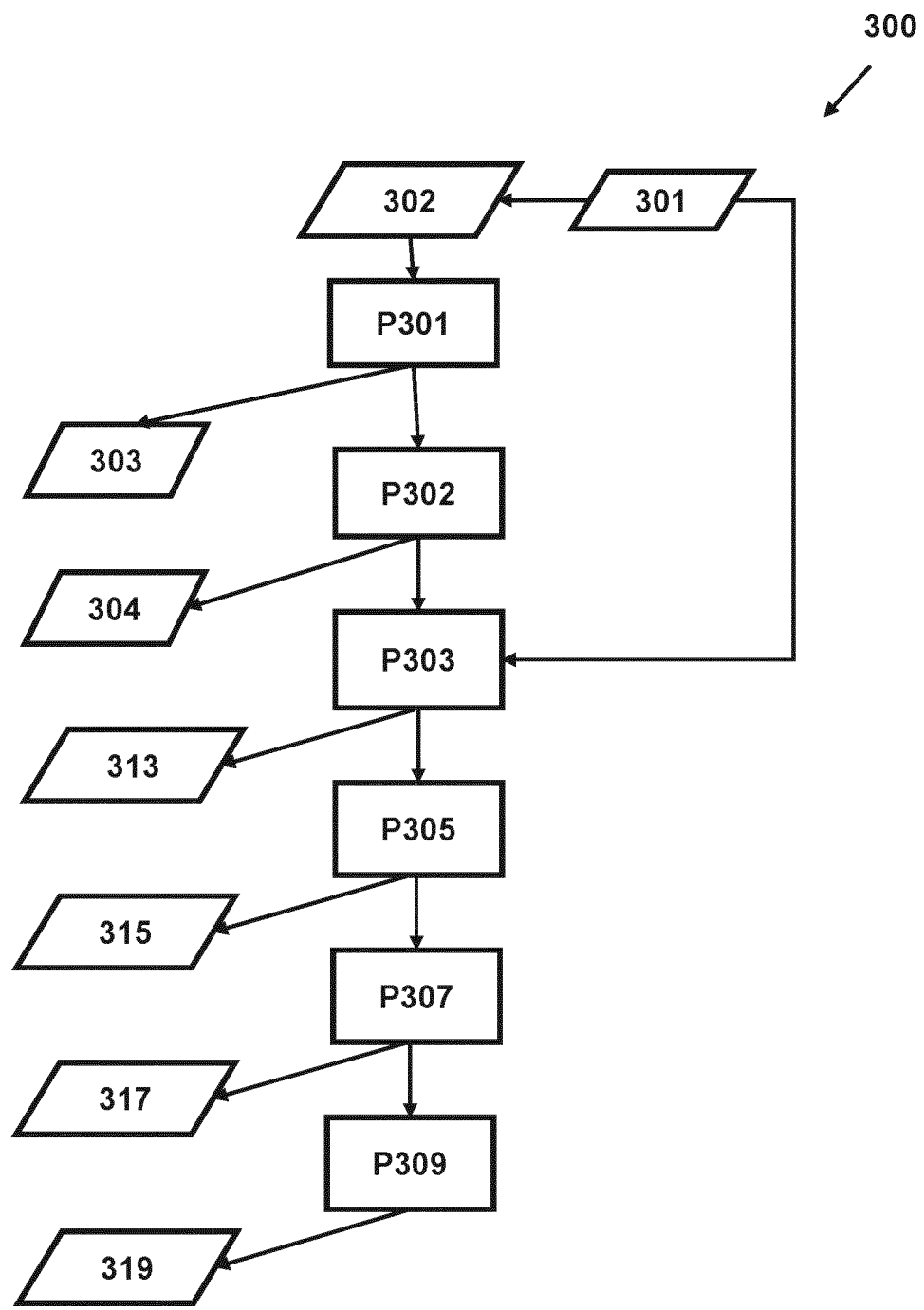
FIG. 3 is a flow chart of a method for extracting contours from raw images (e.g., SEM) of a printed substrate and determining measurements from the extracted contours, according to an embodiment.

FIG. 3 is a flow chart of a method for extracting contours from images (also referred as raw images or metrology images) of a printed substrate. Further, based on the extracted contours, measurement data (e.g., stochastic variation/standard deviation or other relevant measurement statistics) may be determined to characterize both a printed pattern and its printing process. Such measurement data related to both the printed patterns and their printing process may be further used to optimize, via process simulation (e.g., a process simulation in FIG. 2), a patterning process or a patterning recipe related to, for example, OPC, mask pattern, aerial image, resist image, hot spot determination and ranking, source and mask optimization, metrology measurements, or other lithographic applications. The method is further described in detail as follows.

The method, in processes P301 and P302, involves obtaining (i) a plurality of images 302 of the substrate, each of the images comprising a printed pattern corresponding to a reference pattern 301, (ii) an averaged image 303 of the plurality of images 302, and (iii) a composite contour 304 of the printed patterns based on the averaged image 303. In an embodiment, the reference pattern 301 is a design pattern or a simulated pattern corresponding to a design pattern provided in GDS/OASIS file format.

Figure 4A:
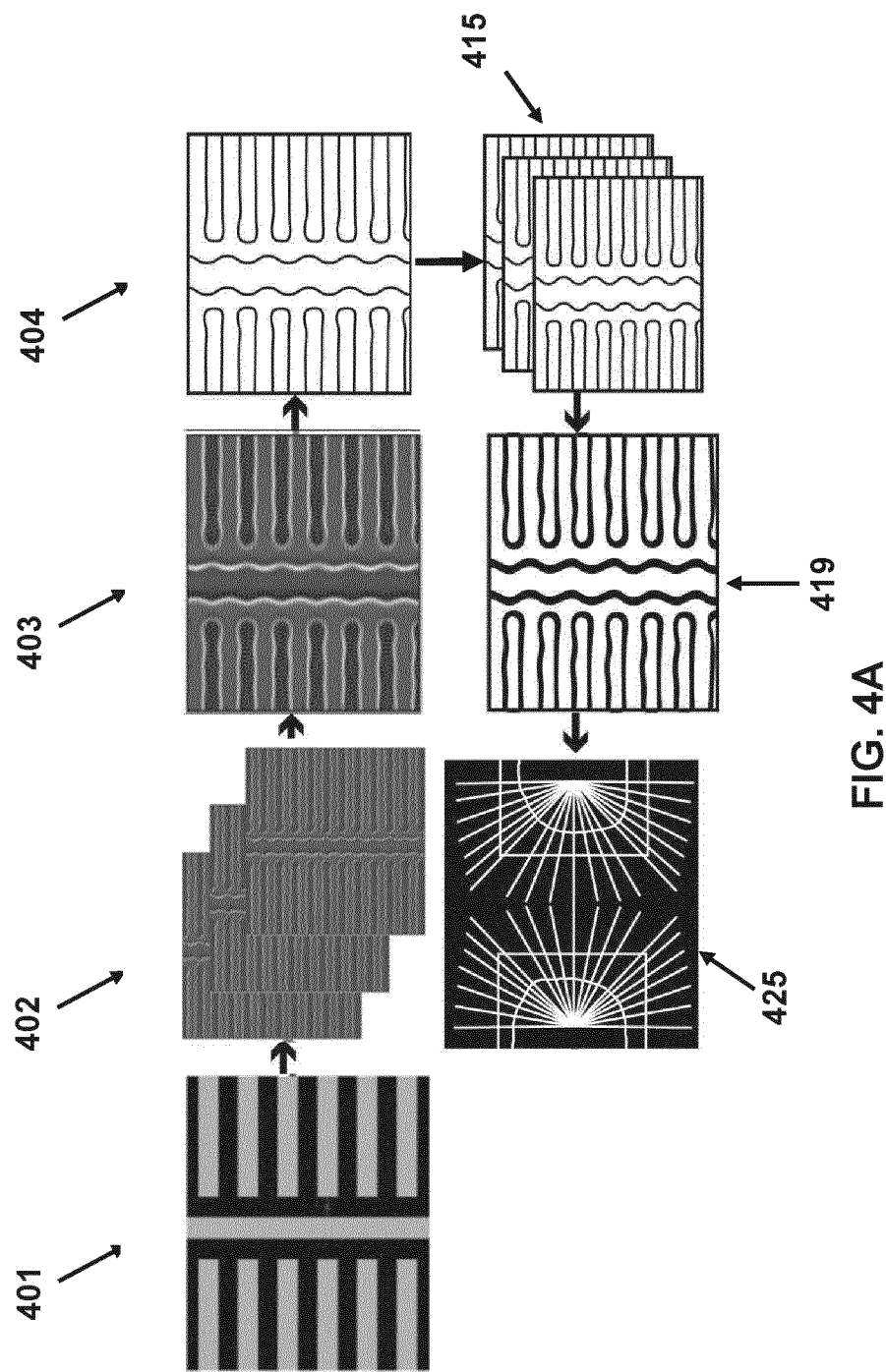
FIG. 4A illustrates an example of extracted contours and measurement data (e.g., stochastic variation) of the printed patterns determined based on method of FIG. 3, according to an embodiment.

In an embodiment, the plurality of images 302 of the substrate are obtained via a metrology tool. In an embodiment, obtaining refers to receiving via a processor (e.g., 104) the images captured by the metrology tool. In an embodiment, the plurality of images 302 are scanning electron microscope (SEM) images. In an embodiment, the image may be represented in a vector form including a signal value and a noise value. In an embodiment, the image is a pixelated image, each pixel comprising a signal value and noise value. A signal value of an image corresponds to a feature of the printed pattern. In an embodiment, wherein the signal value comprises a pixel intensity of a pixel at a particular location of the image. A noise value corresponds to, for example, metrology noise during the measurement process. An example of plurality of images 402 is shown in FIG. 4A, discussed later in the disclosure.

In an embodiment, the plurality of images 302 comprises a first plurality of images of a printed pattern within a particular die, referred as intra-die images of the printed patterns. The first plurality of images can be used to determine intra-die variation ($\sigma_{intra\text{-}die}$) in measurements of the printed patterns of the substrate. Intra-die variation is further discussed with respect to FIG. 7B later in the disclosure.

Furthermore, the plurality of images 302 may comprise a second plurality of images of the printed patterns corresponding to a plurality of dies of the substrate. The second images are referred as inter-die images of the printed patterns. The second plurality of images can be used to determine inter-die variation ($\sigma_{inter\text{-}die}$) in measurements of the printed patterns of the substrate. Inter-die variation is further discussed with respect to FIG. 7C later in the disclosure.

In an embodiment, the obtaining (e.g., in process P301) of the averaged image 303 involves aligning the printed patterns of the plurality of images 302 with respect to each other; identifying locations along the printed patterns of the plurality of images 302 having a relatively high signal values and aligning the identified locations; and determining the average image by computing average values of the signal values of the aligned plurality of images 302. In an embodiment, the aligning the printed patterns of the plurality of images 302 involves shifting one or more images of the plurality of images 302 to align corresponding the printed patterns of the one or more images to the reference pattern 301 such that a difference between the printed patterns of the plurality of images 302 is reduced. An example of average image 403 is shown in FIG. 4A discussed later in the disclosure A detailed description of an example method of averaging image can be found in the U.S. Application No. 62/680,284, filed on Jun. 4, 2018, incorporated herein by reference in its entirety.

Further, in process P302, a composite contour 304 may be obtained from the averaged image 303. A composite contour 304 of the printed patterns is a contour of a printed pattern obtained from a combined image of the plurality of images 302. In an embodiment, the combined image is the averaged image 303 and the composite contour 304 is an averaged contour of contours of the plurality of images 302 or the averaged image 303. In an embodiment, obtaining the composite contour 304 involves aligning the images of the printed patterns with respect to each other such that a difference between the images is reduced; calculating an averaged image of all aligned images, and extracting the composite contour 304 from the average image based on a relatively high signal values at locations with respect to the reference pattern 301. An example of the composite contour 404 is shown in FIG. 4A discussed later in the disclosure. A detailed description of an example method of averaged image and extracting composite contours can be found in the U.S. Application No. 62/680,284, filed on Jun. 4, 2018, incorporated herein by reference in its entirety.

The method, in process P303, involves aligning the composite contour 304 of the averaged image 303 with respect to a reference contour of the reference pattern 301 resulting in an aligned composite contour 313. This process is related to a more general die-to-database alignment process, discussed with respect to FIG. 9A.

In an embodiment, the aligning of the composite contour 304 involves overlapping the composite contour 304 with the reference contour; and shifting the composite contour 304 within a predefined range such that a difference between the composite contour 304 and the reference contour (of 301) is reduced. In an embodiment, the shifting of the composite contour 304 involves shifting the composite contour 304 with respect to a center of the predefined range such that a total contour-to-contour distance is reduced; and shifting the composite contour 304 in a first direction to reduce a first contour-to-contour difference in the first direction, and/or shifting in a second direction to reduce a second contour-to-contour difference in the second direction.

The method, in process P305, involves extracting raw contours 315 from a given image of the plurality of images 302 (raw images) with respect to the aligned composite contour 313. A raw contour extracting is based on the aligned composite contour 313, a raw image 302 and the normal direction (an angle with respect to the composite contour which is output in process P303) of each contour point on the aligned composite contour. In an embodiment, the extracting of a contour of the plurality of contours 315 involves: i) identifying a starting point in the given image with respect to the composite contour, ii) finding direction for raw contour edge searching with the aid from the output of process P303, and iii), determining an edge position of the raw contour for the given image of the plurality of images.

The method, in process P307, involves determining a plurality of pattern measurements 317 based on the plurality of contours 315. The pattern measurements 317 are characteristics (e.g., CD, EPE, etc.) of both the printed patterns and their printing process. In an embodiment, the determining of the pattern measurement involves defining a set of cut lines (e.g., discussed with reference to FIG. 5); passing through a given contour of the plurality of the contour; defining a plurality of measurement gauges along the given contour, wherein a measurement gauge is defined at an intersection of a cut line and the given contour; and determining the pattern measurement with respect to the measurement gauge.

In an embodiment, the pattern measurements 317 are critical dimensions of the printed patterns, and/or an edge placement measurements of the printed patterns with respect to the reference pattern 301. In an embodiment, a critical dimension of the critical dimensions is a distance between two measurement gauges along a horizontal cut line intersecting the given contour (see e.g., in FIG. 5).

In an embodiment, an edge placement measurement is an edge placement error determined at the measurement gauges along the given contour, wherein the edge placement error is a difference between the given contour and the reference contour at a given measurement gauge.

The method, in process P309, involves the determining of the measurement data 319, involves determining a first statistic ($\sigma_{intra\text{-}die}$) corresponding to the printed patterns based on the plurality of measurements related to a particular die of the substrate (e.g., intra-image); and/or determining a second statistic ($\sigma_{inter\text{-}die}$) corresponding to the printed patterns based on the plurality of measurements related to a particular field location across different dies of the substrate; and/or determining a third statistic (e.g., $\sigma_{SEPE}$) associated with the printed patterns based on the plurality of measurements related to a particular feature within each image field of view (FOV). In an embodiment, the total variation is included as all parts of the measurement data 319 of a printed pattern.

In an embodiment, the third statistic is stochastic variations in measurements of the printed patterns. All other statistics (e.g., first and second statistic) are results from the other process variations.

In an embodiment, the first statistic is an intra-die variation in measurements of the printed patterns of the substrate.

In an embodiment, the second statistic is an inter-die variation in measurements of the printed patterns of the substrate, and the third statistic is an intra-image Field of View (FOV) variation, i.e. stochastic variation where other process variations are assumed to be negligible within image FOV.

FIG. 4A illustrates an example of extracting contours of printed patterns from raw images and an example stochastic variation band determined based on the contours of the printed patterns.

In FIG. 4A, a reference pattern 401 may be received (e.g., via a processor 104), for example, in a form of GDS/OASIS file format, which is a different format than the SEM image format. Accordingly, coordinates or locations of a pattern in the images and the GDS format will be different. In an embodiment, the reference pattern 401 may be a design layout, or a simulated layout obtained as an output of a process simulation. The reference pattern 401 comprises a plurality of features that are desired to be printed on the substrate imaged via a lithographic apparatus. In the present example, the reference pattern 401 comprises horizontal lines having a pitch, and vertical line. In another example, the reference pattern 401 may include contact holes or other geometric structures corresponding to IC to be printed on the substrate.

The reference pattern 401 may be printed at different location on the substrate. For example, the reference pattern 401 may be printed at different locations within a particular die, and/or across different dies on the substrate. For example, a printed substrate may include thousands or even millions of instances of printed patterns corresponding to the reference pattern 401. In an embodiment, images of the printed substrate may be obtained, via a metrology tool (e.g., SEM, optical tools, or other image capturing tools). Typically, such images of the substrate are obtained for measuring a characteristic (e.g., CD, EPE, etc.) of the printed pattern, inspecting quality of printed patterns, identifying faults in printed patterns, hot spots, etc.

Figure 10:
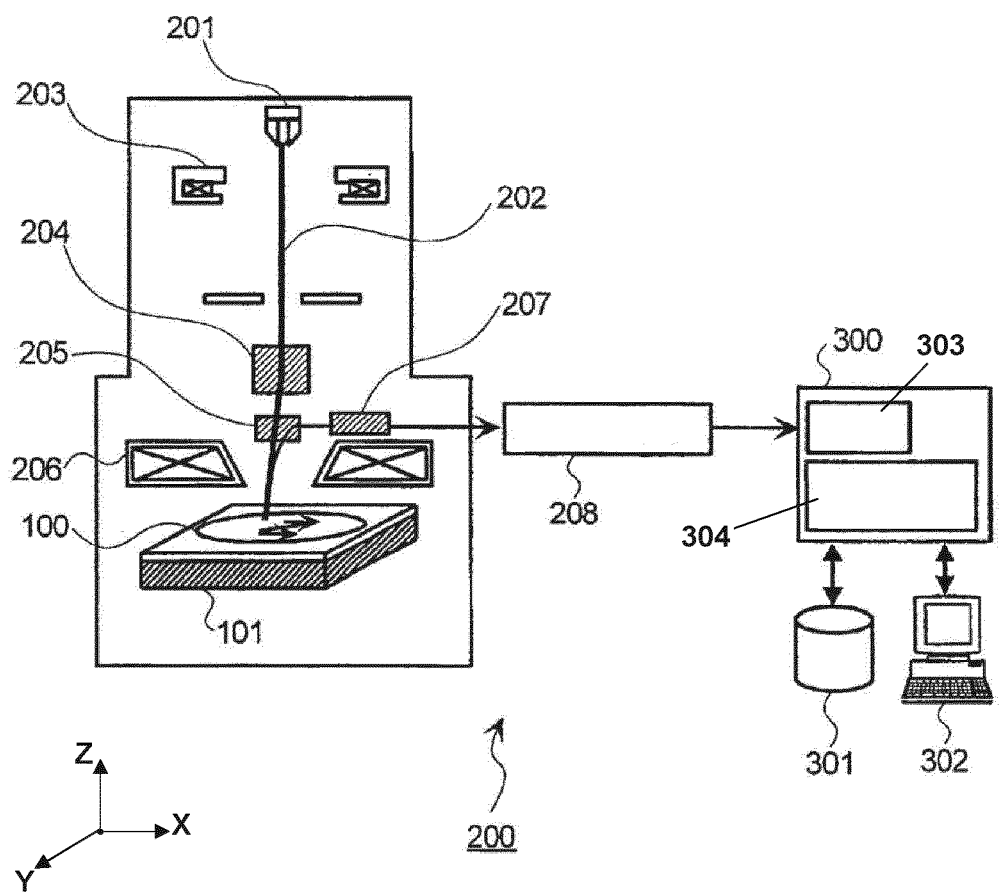
FIG. 10 schematically depicts an embodiment of a scanning electron microscope (SEM), according to an embodiment.
Figure 11:
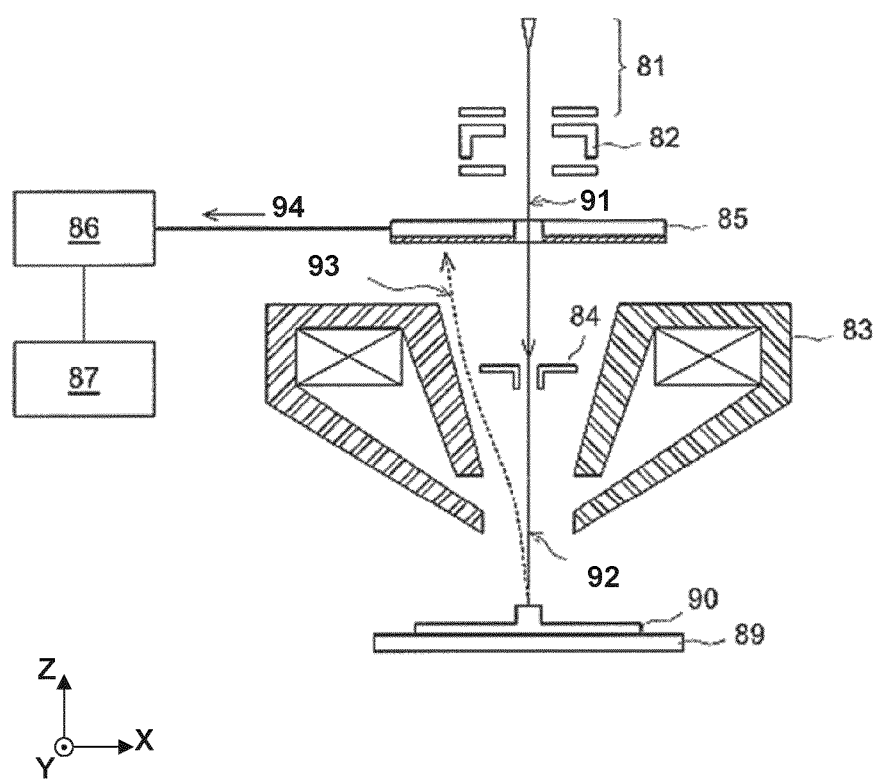
FIG. 11 schematically depicts an embodiment of an electron beam inspection apparatus, according to an embodiment.

A plurality of images 402 (also referred as raw images 402 for better readability) corresponding to the reference pattern 401 are obtained, for example, via SEM tool (e.g., discussed in FIGS. 10-11). In an embodiment, a first plurality of images are captured from a first die, a second plurality of images are captured from a second die of the substrate, and so on. Each such images include the printed pattern corresponding to the reference pattern 401. For example, the printed patterns include horizontal lines and vertical lines corresponding to the reference pattern 401. However, the printed patterns in the raw images 402 may be inconsistent, distorted, and/or include variations induced due to the pattern process and/or the metrology tool.

In an embodiment, the raw images 402 are distorted, fuzzy, and/or include a noise component, which makes it difficult to accurately identify a printed pattern's shape, size, and/or a contour. Although, a de-noising filter may be applied to partially or completely remove noise from the images, determining of the contour and corresponding measurements therefrom may be inaccurate as SEM measurement process itself may involve process inaccuracy such as an e-beam may affect the resist during capturing of the substrate image thereby capturing a distorted image. Thus, in order to make accurate measurements of the printed pattern, additional image processing is performed (e.g., averaging process, processes P303 and P305) as discussed in the method of FIG. 3. In an embodiment, combining images reduce the effects of noise or other forms of error that can be present in any single image. In one embodiment, combined image 403 can be generated by averaging multiple measured images 402. In other embodiments, multiple measured images 402 can be aligned before combining or averaging. Example method of obtaining an average image is discussed in U.S. Application No. 62/680,284, filed on Jun. 4, 2018, which is incorporated herein by reference in its entirety.

In an embodiment, the raw images 402 are aligned with respect to each other to determine an average image 403. Such alignment involves the raw images corresponding to different dies by moving one or more raw images with respect to each other. For example, the alignment involves shifting one or more images such that portion of the image having relatively high signal to noise ratio are overlapped. In an embodiment, the shifting is limited to a particular range (e.g., within 0.05 nm to 1 nm range) around the pixel location where the signal values is relatively high. An example of signal in an image is shown in FIG. 4B.

Figures 4B, 4C:
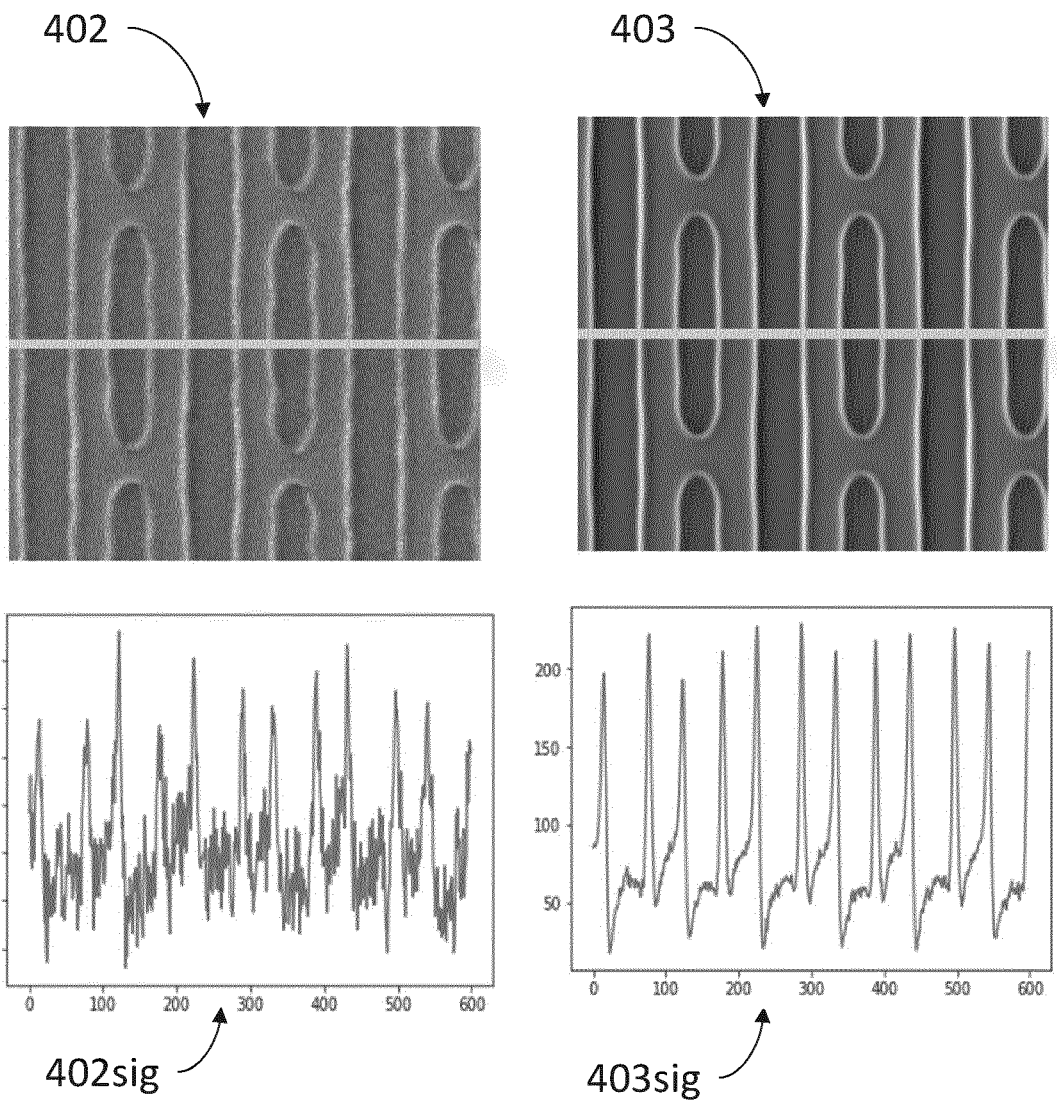
FIG. 4B is an example SEM image and signal within the SEM image of a printed pattern, according to an embodiment.
FIG. 4C is an example of averaged image and signal within the averaged image of the printed pattern of FIG. 4B, according to an embodiment.

In FIG. 4B, shows an example raw image 402 and a signal 402sig along a line at the center of the raw image 402. The signal 402sig has peaks (e.g., approximately at 200) indicating a strong signal and weak signal (e.g., around 75-100 values). The signal 402sig also include noise, thus the signal 402sig is noisy (e.g., around the value 100). Due to the noise, the raw image 402 is noisy and may need de-noising filter to remove the noise and improve the signal-to-noise ratio. On the other hand, the averaged image 403 is relatively less noisy or no noise. Thus, the signal along a line at the center has less noise and a relatively higher signal-to-noise ratio compared to the raw image 402.

In embodiment, the raw images 402 may be pixelated images, in which case, pixels having relatively high intensity values are aligned with respect to corresponding locations of pixels in other images. For example, pixel locations within a first raw image having relatively high pixel values may be identified and aligned with corresponding pixel locations of the second raw image. However, other images may not have high pixel intensity at same location, but in close proximity around the given pixel location. Hence, a sub-pixel adjustment of the second image may be performed to better align the printed patterns of first image and the second image. Once, the images 402 are aligned an average image 403 may be computed by taking an average value of each of the locations within the images 402.

The averaged image 403 includes averaged printed patterns, which have a relatively clearer boundary (e.g., see 403 and 403sig in FIG. 4B) than seen in the raw images 402. Further, a composite contour 404 is extracted from the averaged image 403 thereby averaging out any inaccuracies in the raw images 402.

In an embodiment, (e.g., as discussed in process P303 of FIG. 3), the aligned composite contour may be determined by aligning the composite contour from the averaged image 403 with the simulated contour of reference pattern 401 (not shown). The alignment process may be an iterative process, where a difference between the composite contour and the reference contour of the reference pattern 401 is reduced (in an embodiment, minimized). Such alignment process also ensures that the resulting composite contour 404 correspond to locations of the design pattern (e.g., GDS locations), which is typically used during the patterning process simulations. In an embodiment, such composite contours 404 may be used for patterning process simulations to optimize an aspect of the patterning process such as OPC, mask, resist, etc. However, using composite contour 404 do not preserve stochastic variation related information of the printed patterns that may be useful for further improving pattern measurement and optimization of patterning process.

In an embodiment, (e.g., as discussed in process P305), the aligned composite contour from the averaged image is further used to guide extracting contours 415 of the printed patterns in the raw images 402 (e.g., SEM images). The extracting a contour from a SEM images 402 includes involves i), identifying a starting point in the given image with respect to the composite contour, ii), finding a direction of the point for contour edge searching with the aid from the output of process P303, and iii), determining an edge position of each contour point for a raw image.

Once, contours of the printed patterns in the raw images 402 are extracted, the extracted contours 415 may be overlapped with each other to determine a variation band (e.g., band 419) of the printed patterns. The variation band indicates that the reference pattern 401 is not printed uniformly or has varied dimensions/shape at different locations of the substrate. This band is an estimate of the total variation. Part of such variation is due to the stochastic variations, the other parts are coming from the patterning process and/or the measurement process (e.g., in the SEM tool or other metrology tool). Thus, each variation information (e.g., a stochastic variation, inter-die variation, intra-die variation and so on) related to each of the raw images 402 is decomposed and retrieved in the subsequent data analysis. In an embodiment, the stochastic variation band 419 may be determined based on measurements related to the extracted raw contours (e.g., as discussed in processes P307 and P309). Such stochastic variation band 419 can be further used to improve an existing patterning process thereby improving yield (e.g., less defective printed patterns) of the patterning process.

In an embodiment, measurements may be performed on the stochastic variation band 419 and/or raw contours 415 as illustrated in measurements 425 performed along an edge of an extracted contour relative to the reference contour. As discussed in FIG. 3, the measurements 425 involves defining cut-lines and gauges along the contour, e.g., at the intersection of the cut-lines and the contour. An example measurement based on gauge placement is illustrated and discussed with respect to FIG. 5.

Figure 5:
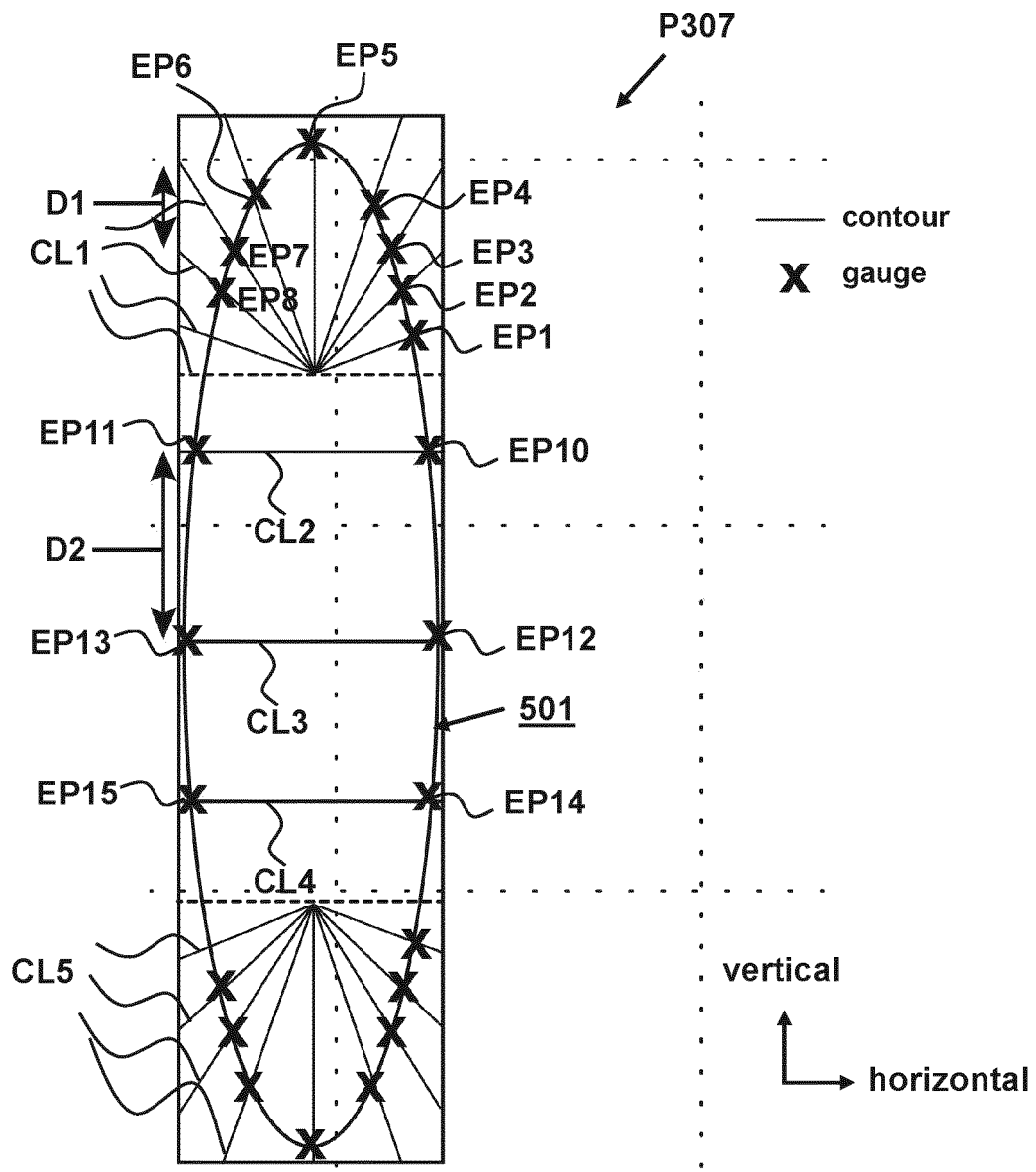
FIG. 5 is an example of determining measurements of a contour of an example printed pattern, according to an embodiment.

In FIG. 5, a contour 501 may be an extracted contour, a contour from an averaged image or raw image, or a reference contour. For measurements, different cut-lines may be defined based on the geometry of the contour and locations where measurements are desired. For example, for curved portions, cut-lines CL1 and CL5 are angular cut-lines originating from respective centers of curved portions of the contour 501. For relatively straight portions, cut-lines CL2, CL3, and CL4 are horizontal cut lines separated vertically along the length of the contour 501. The cut-lines CL1 intersect with the contour 501 at EP1-EP8, which are example gauge points at which measurements may be determined. For example a vertical distance D1 may be determined between cut-lines related to gauge points EP7 and EP8 or using the uniform angle between EP7 and EP8 to place cut-lines, a distance D2 may be determined between gauge points EP11 and EP13, a horizontal dimension (an example of CD) may be measured between EP10 and EP11 (EP12 and EP13, or EP14 and EP15). In an embodiment, the measurements are characteristics of a feature and/or the printed pattern. Such measurements can be determined for each of the extracted contours from raw images (e.g., 415) which can be further used to determine a stochastic variation band (e.g., 419).

One of the advantages of the measurements based on the contours extracted according to the present disclosure is that separate methods of measuring a 1D feature (e.g., LWR) and 2D features (e.g., LCDU) of a printed pattern need not be used. The present method provides a unified solution (e.g., in the form of a stochastic variation band) for measuring different feature types (e.g., 1D, 2D, etc.) thereby providing an unified basis for comparing and modeling effects of stochastic variation and modifying different aspects of the patterning process to improve the yield of the patterning process.

Figure 6A:
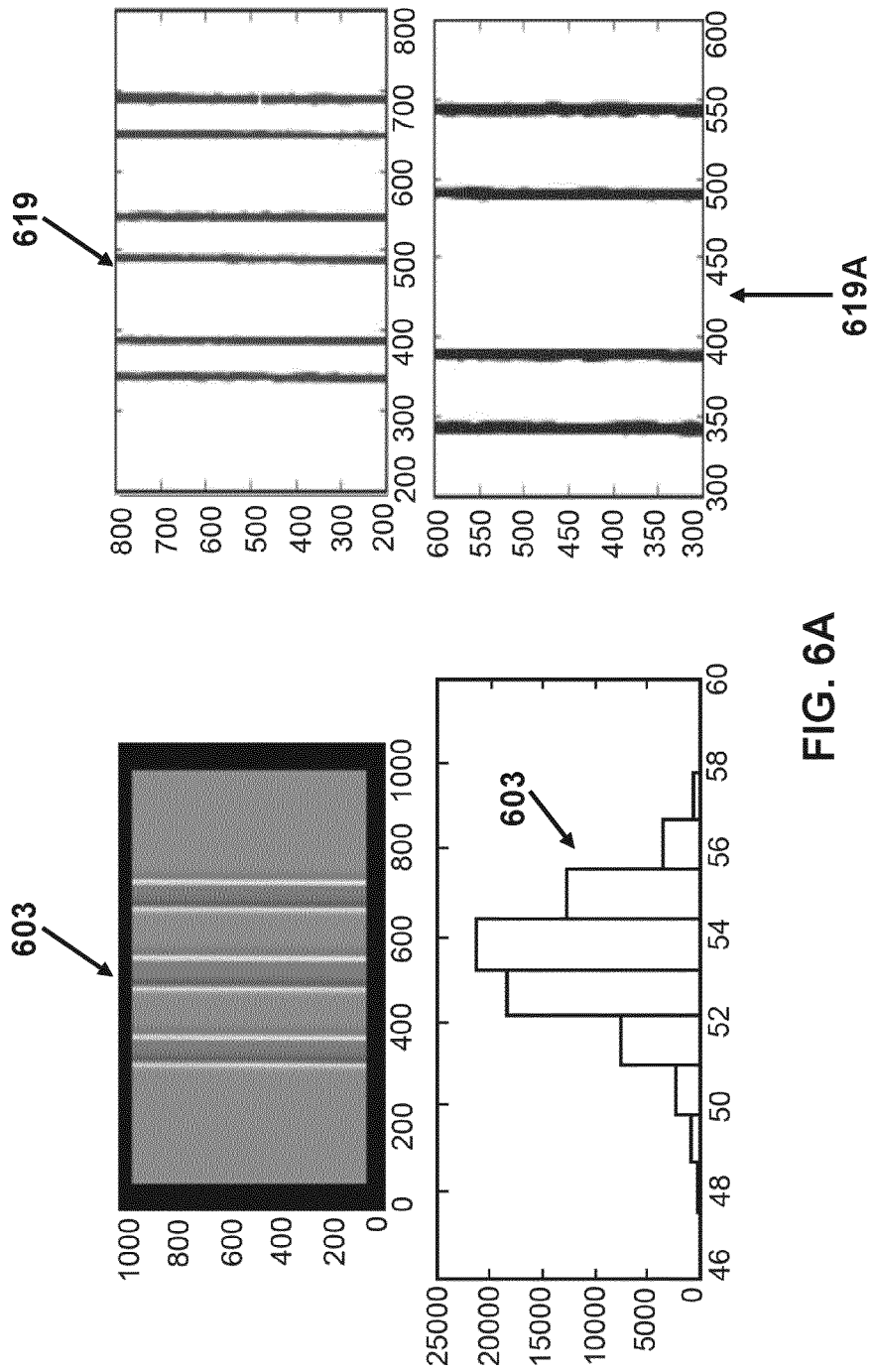
FIG. 6A is an example of an averaged image of an example one-dimension (1D) pattern, corresponding stochastic band of the 1D pattern, and distribution of CD values of the 1D patterns, according to an embodiment.

FIG. 6A illustrates an example measurements related to a 1D pattern comprising vertical lines. In FIG. 6A, an averaged image 603 comprises three vertical lines having similar CD specification (e.g., 55 nm in width). As discussed above (e.g., in FIG. 4A), when raw images corresponding to such pattern is obtained and measurements are performed, a stochastic variation band 619 associated with the averaged contour of the average image 603 is obtained. A band 619A is just a magnified version of a portion of the stochastic band 619 provided for better visual understanding. In an embodiment, the measurements may be CD values as illustrated in bar plot 617. The bar plot 617 illustrates a variation in CD values of the printed patterns based the average image 603. Such information of variation in CD values can be further used to extract inter-die, intra-die, intra-image FOV, and total variation and improve the patterning process (e.g., OPC).

Figure 6B:
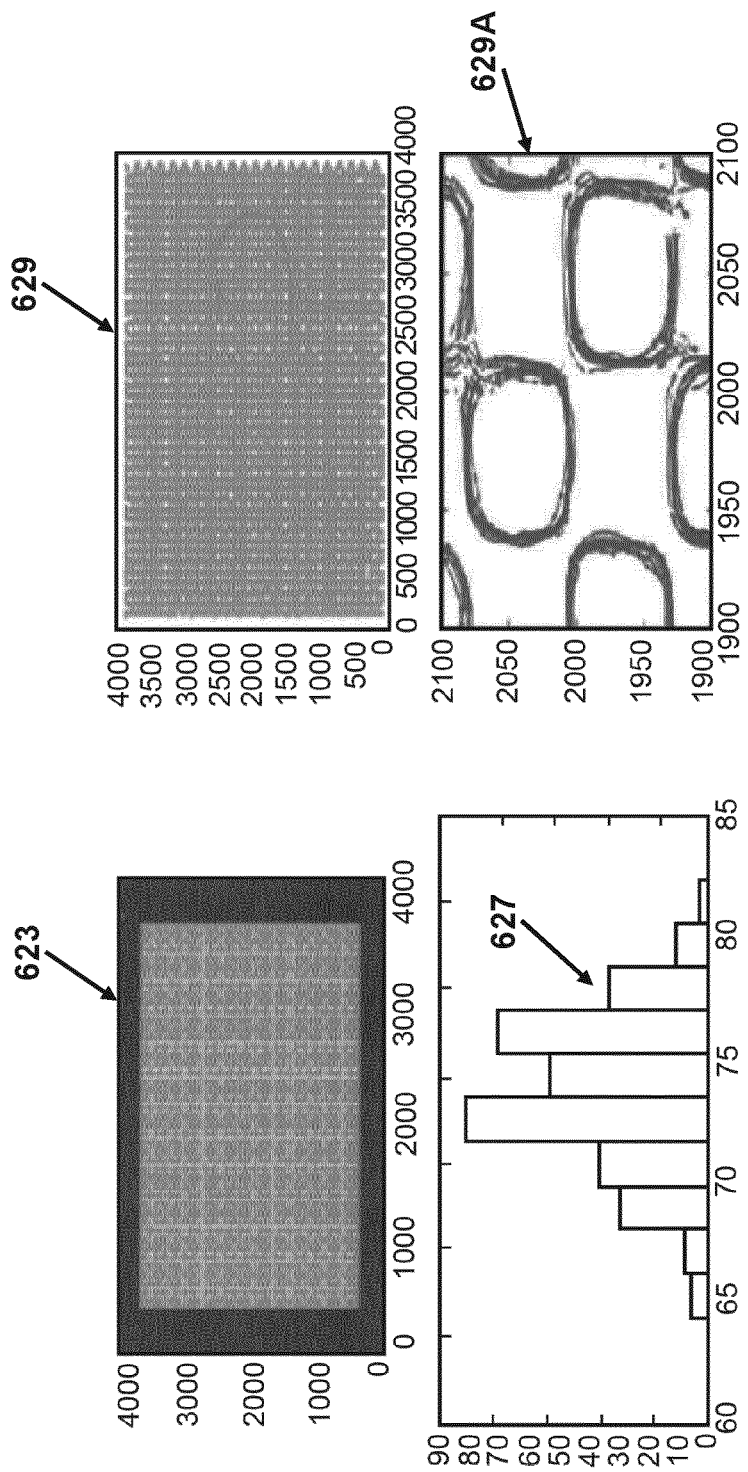
FIG. 6B is an example of an averaged image of an example two-dimension (2D) pattern, corresponding stochastic band of the 2D pattern, and distribution of CD values of the 2D patterns, according to an embodiment.

FIG. 6B illustrates an example measurements related to a 2D pattern comprising contact holes. An averaged image 623 comprises a plurality of contact holes having similar CD specification (e.g., 75 nm in diameter). As discussed above (e.g., in FIG. 4A), when raw images corresponding to such pattern is obtained and measurements are performed, a stochastic variation band 629 associated with the averaged contour of the average image 623 is obtained. A band 629A is just a magnified version of a portion of the stochastic band 629 provided for better visual understanding. In an embodiment, the measurements may be CD values (e.g., diameter) as illustrated in bar plot 627. The bar plot 627 illustrates a variation in CD values of the printed patterns based the average image 623. Similar to 1D pattern, information of variation in CD values can be further used to extract inter-die, intra-die, intra-image FOV, and total variation and improve the patterning process (e.g., OPC).

Figure 6C:
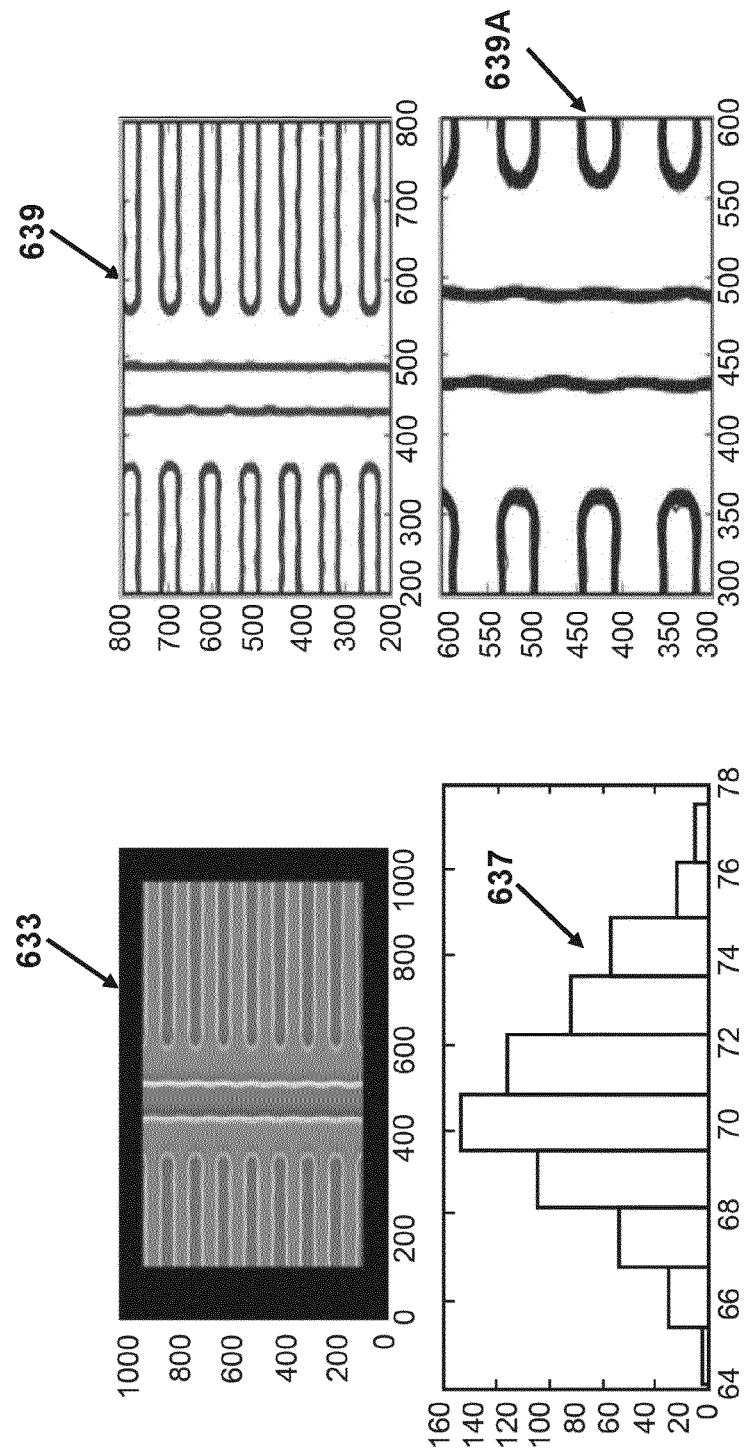
FIG. 6C is an example of an averaged image of another example of two-dimension (2D) pattern, corresponding stochastic band of the 2D pattern, and distribution of CD values of the 2D patterns, according to an embodiment.

FIG. 6C illustrates another example measurements related to a 2D pattern comprising a combination of horizontal lines and a vertical line. Similar to FIG. 6A, an averaged image 633 and raw images related to desired 2D pattern are used to obtain measurements and a stochastic variation band 639 (and a magnified portion 639A) associated with the averaged contour of the average image 633. In an embodiment, the measurements may be CD values as illustrated in bar plot 637. The bar plot 637 illustrates a variation in CD values of the printed patterns based the average image 633. Such information of variation in CD values can be further used to extract inter-die, intra-die, intra-image FOV, and total variation improve the patterning process (e.g., OPC).

Note that in FIGS. 6A, 6B, and 6C, although the patterns are of different types including 1D and 2D patterns, the measurements are in the same measurement system as opposed to separate system such as LWR for 1D and LCDU for 2D. Furthermore, in an embodiment, the measurement is not only unified, but also LWR and LCDU may also be determined (e.g., using gauges) based the raw images and the stochastic variation band.

Figure 7A:
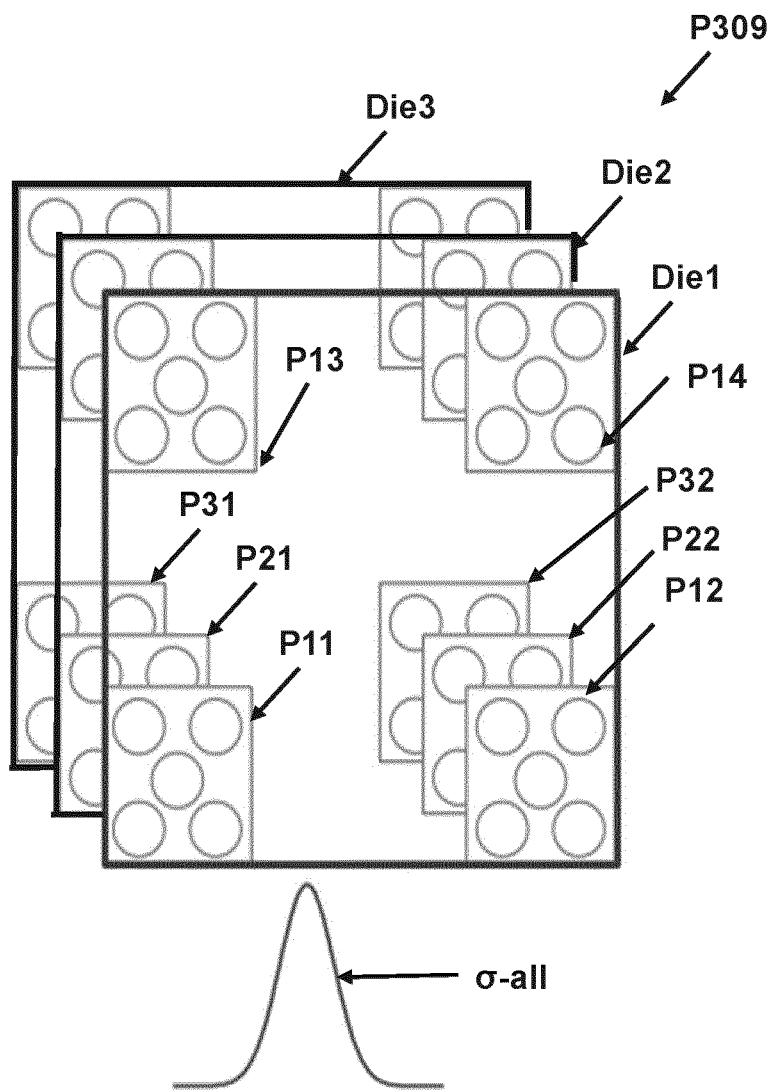
FIG. 7A illustrates example images including printed patterns of different dies and across die and determination of total variation, i.e. $\sigma_{all}$, according to an embodiment.
Figure 7B:
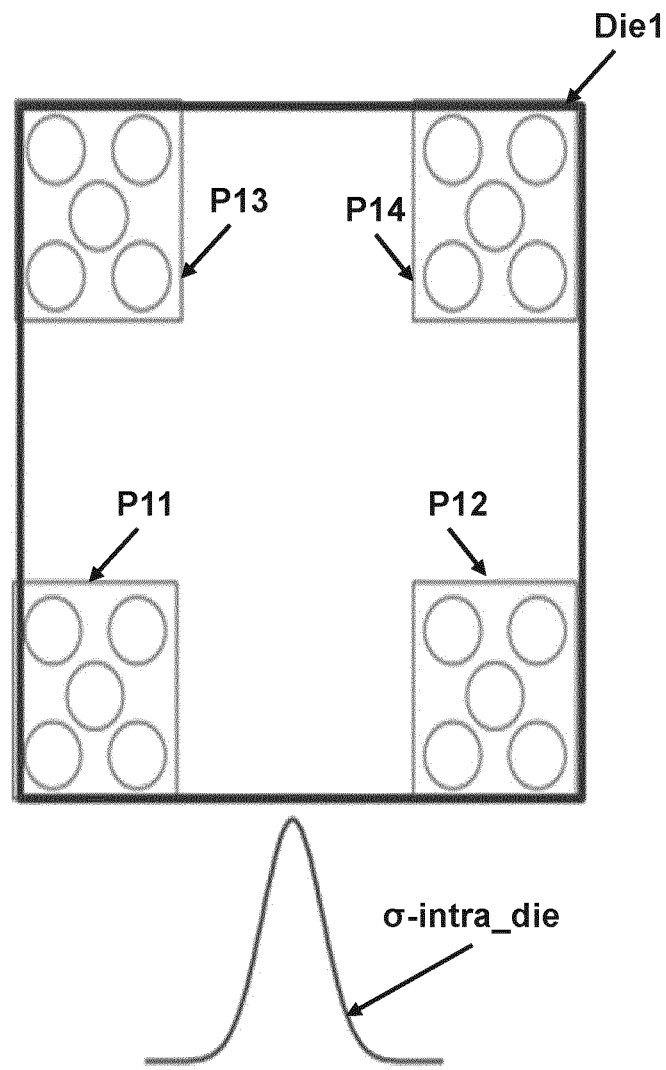
FIG. 7B illustrates example images across a die of printed patterns and determination of intra-die variation, i.e. $\sigma_{intra-die}$, according to an embodiment.
Figure 7C:
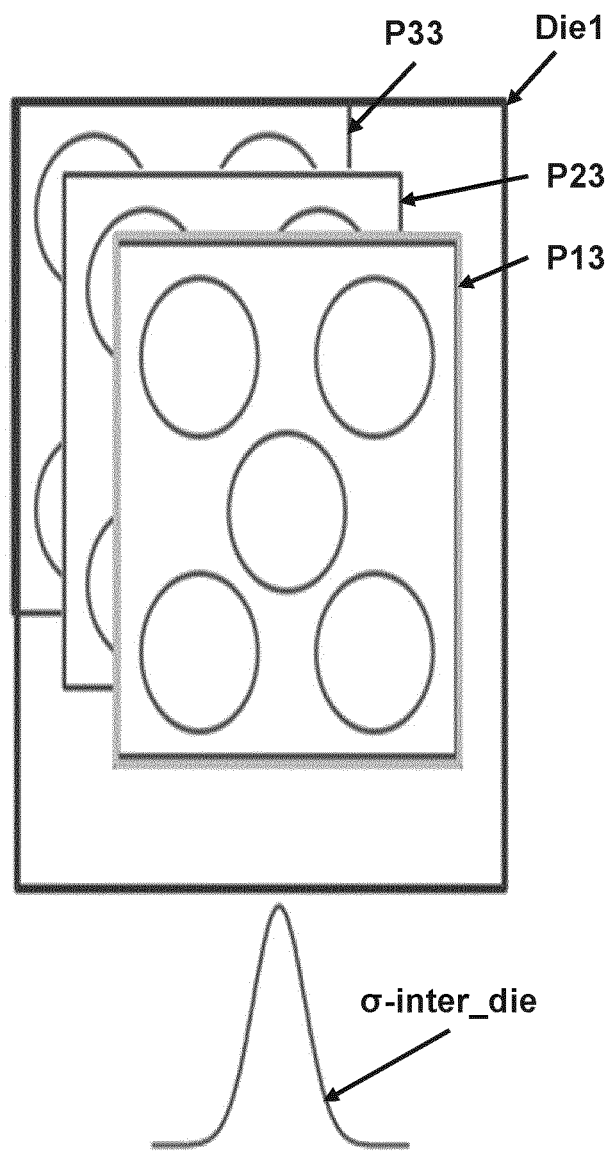
FIG. 7C illustrates example images between different dies of single printed pattern and determination of inter-die variation, i.e. $\sigma_{inter-die}$, according to an embodiment.
Figure 7D:
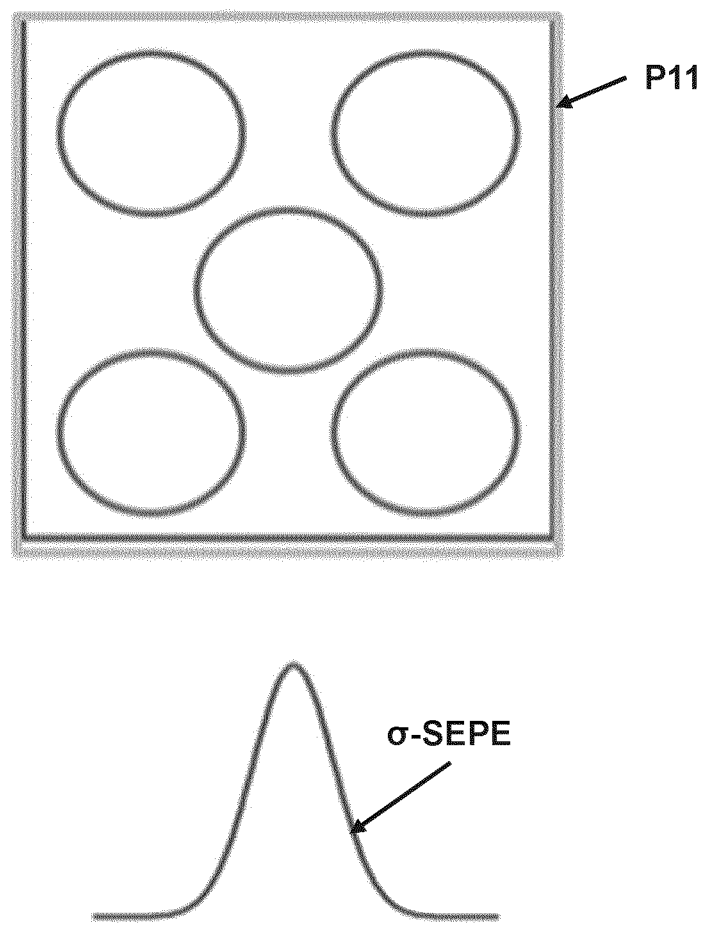
FIG. 7D illustrates example image field of view (FOV) of single printed pattern and determination of intra-image field of view (FOV) variation, i.e. $\sigma_{sepe}$, according to an embodiment.

In an embodiment, different variations in measurement may be determined based on raw images corresponding to inter-die and/or intra-die and/or intra-image FOV, for example as discussed with FIGS. 7B, 7C, and 7D.

FIG. 7A illustrates example raw images that accounts for all the variations (e.g., inter-die and intra-die process variations, and measurement related variations). While FIGS. 7B, 7C, and 7D illustrate how to compute individual variations referred as intra-die, inter-die and intra-image FOV variations. These individual variations substantially contribute to or explains most of the variations in FIG. 7A.

In FIG. 7A, the raw images correspond to different dies (e.g., Die1, Die2, Die3) of a substrate. Each raw image comprises a set of patterns comprising five contact holes. Such printed pattern in the images is associated with a reference pattern (not shown) comprising five reference contact holes (not shown). For example, a first raw image Die1 is a cartoon of a SEM image of a first die of a printed substrate that includes four patterns (e.g., P11, P12, P13, P14) having five contact holes each. Similarly, a second raw image Die2 of a second die includes four patterns (e.g., P21, P22, . . . ) having five contact holes each, and a third raw image Die3 of a third die comprises four patterns (e.g., P31, P32, . . . ) having five contact holes each. In an embodiment, a probability distribution function of a metric such as CD pdf is associated with such variation represented as σ-all.

FIG. 7B illustrates four patterns P11, P12, P13, and P14 each having a set of five contact holes. In this case, the intra-die variation σ-intra_die of a particular die (e.g., a first die image) is determined based on variations in the four patterns P11-P14 within the particular die. Similarly, intra-die variations of the second and third die may be determined based on the four patterns within each of the dies. In an embodiment, a probability distribution function of a metric (e.g., CD pdf) for each die is associated with each such variation represented as σ-intra_die.

FIG. 7C illustrates inter-die variations i.e., variations in a particular pattern across different dies. For example, variations (e.g., in CD) are determined in a third pattern set P13, P23, P33 (e.g., at upper left corners of each die in FIG. 7A) of different dies. Similarly, a variation in other pattern sets may be determined. In an embodiment, a probability distribution function of a metric (e.g., CD pdf) across different dies is associated with such variation represented as σ-inter_die.

Furthermore, a stochastic variation (e.g., stochastic edge placement error SEPE) within an image (e.g., intra-image FOV) may be determined. For example, FIG. 7D illustrates a variation σ-SEPE in the five contact holes within the FOV and a pdf associated with the variation σ-SEPE. Similarly, such a variation may be determined for other set of images. Final σ-SEPE can be from an individual image or a set of images with variety of combination.

Figure 8A:
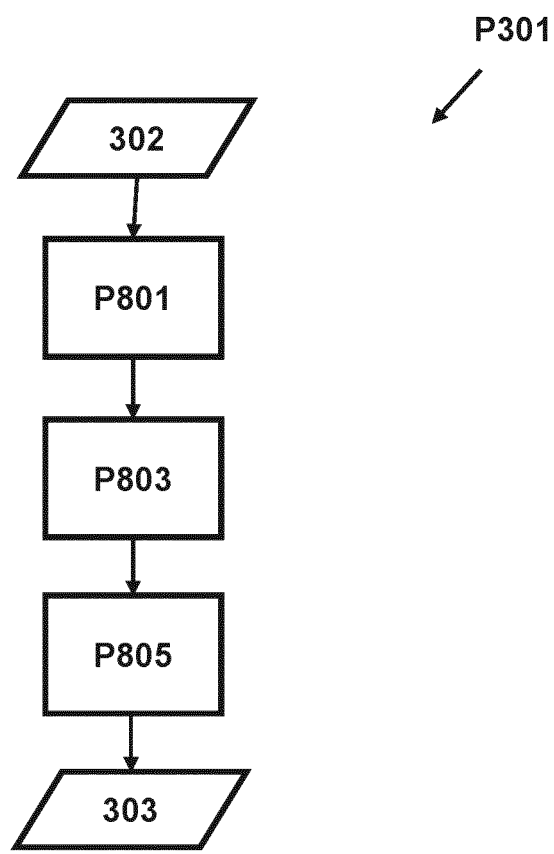
FIG. 8A is an example die-to-die image alignment process, according to an embodiment.

FIG. 8A is an example flow chart of a process for obtaining averaged image based on an die-to-die aligning process that may be used in process P301. In an embodiment, the raw images may be pre-processed to remove noise, for example, via a de-noising filter. In an embodiment, the averaging of the raw images 302 may involve, in step P801, grouping the raw images including similar patterns, or grouping the raw images of a particular die having similar printed patterns, or other grouping approach. In step P803, the process involves aligning the printed patterns of the plurality of images with respect to each other. In an embodiment, the aligning of the printed patterns is such that the aligned images best match a reference pattern.

Figure 8B:
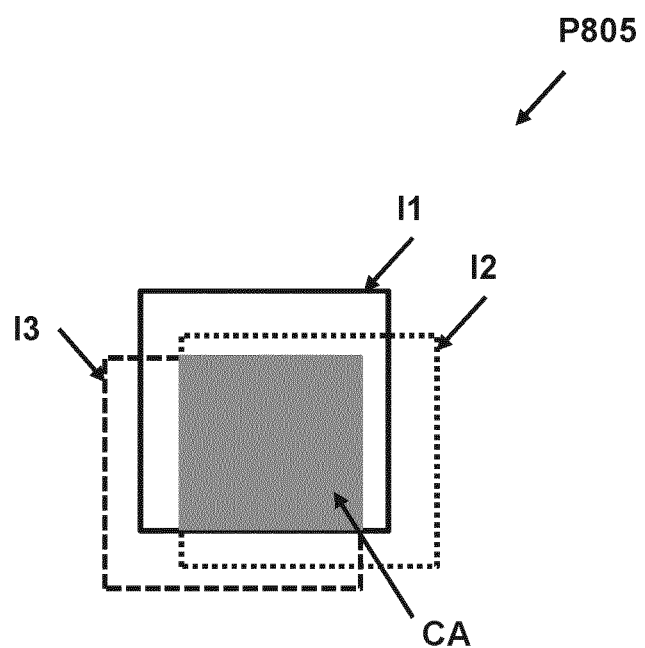
FIG. 8B is an example sub-pixel shifting to find a common area of the aligned images according to the process of FIG. 8A, according to an embodiment.

In step P805, the process involves identifying locations along the printed patterns of the plurality of images, e.g., having a relatively high signal values, and aligning based on the identified locations. In an embodiment, the aligning based on signal values involves shifting one or more images of the plurality of images to align corresponding printed patterns of the one or more images to the reference pattern such that a difference between the printed patterns of the plurality of images is reduced (in an embodiment, minimized). In an embodiment, the shifting of the one or more images is limited to a certain predefined range. Upon shifting in an iterative manner, a common area with high signal-to-noise ration image is obtained. FIG. 8B illustrates an example sub-pixel alignment, e.g., used in the step P805. Referring to FIG. 8B, images I1, I2, and I3 (which are examples of raw images 302) are shifted relative to each other resulting in a common area CA having a relatively high-signal-to-noise ratio compared to other shifting combination of images 302.

Once, the raw images 302 are aligned, in step P807, the average image 303 is determined by computing average values of the signal values of the aligned plurality of images. The resulting average image 303 has a better defined contours with very high signal to no noise ratio compared to raw images 302. Further, the high quality composite contour (304) of the averaged image may be extracted and further used to guide raw image contour extraction, for example, as discussed in FIG. 9A.

Figure 9A:
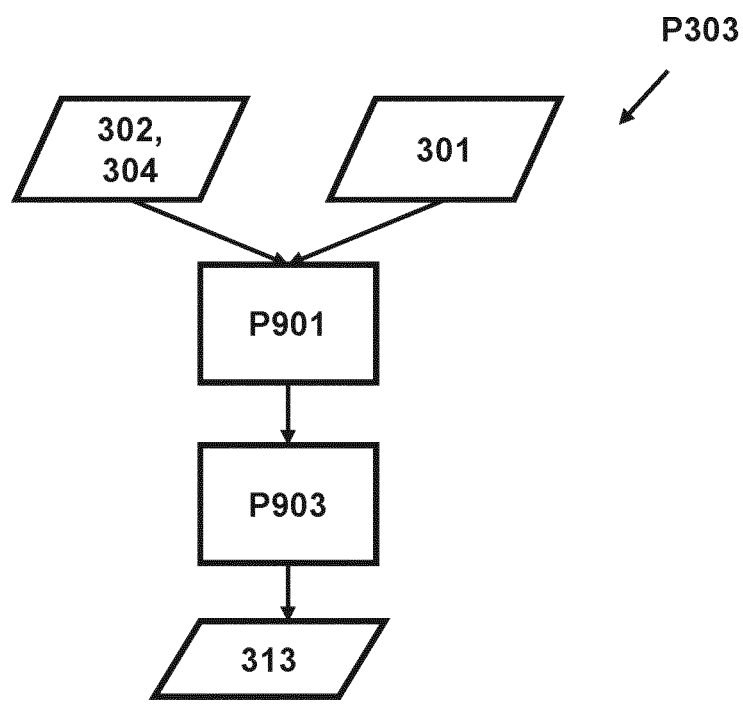
FIG. 9A is an example die-to-database image alignment process, according to an embodiment.

FIG. 9A is an example flow chart of a die-to-database alignment process 900. In an embodiment, a D2DB alignment translates SEM contour address from SEM image coordinates to GDS coordinates so that SEM contour can be compared with reference contour (simulation contour on GDS). According to an embodiment, this D2DB operation allows finding contour point direction for, e.g., a contour adjustment at the subsequent stage such as contour extraction from raw images.

The die-to-database alignment may be used for aligning-composite contour (e.g., 304) or contours of the raw images 302 (e.g., contours of printed patterns in SEM images) with reference pattern 301 (e.g., a design layout in GDS, other desired pattern). Such die-to-database alignment ensures that the locations within an image (raw image or average image) is converted to locations of the format used for the reference pattern (e.g., GDS locations). The process 900 may be employed e.g., in the process P303 for aligning contours e.g., averaged contour 304 or contours extracted from raw images 302 based on the averaged contour 304.

Figure 9B:
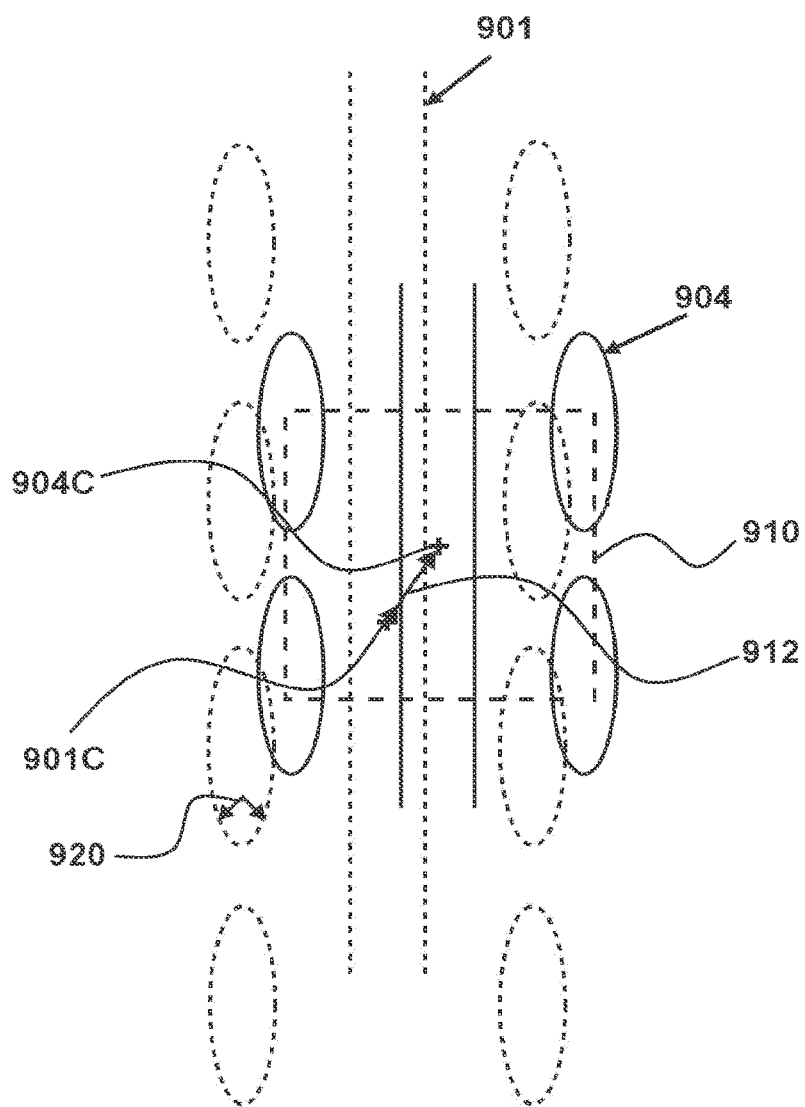
FIG. 9B is an example extracted contour and a reference contour and die-to-database alignment process according to the process of FIG. 9A, according to an embodiment.

The process 900, in step P901, involves aligning, e.g., the composite contour 304 (or contours of raw images) with the reference contour of the reference pattern 301 such that a contour-to-contour difference is reduced (in an embodiment, minimized). In the step P901, the contour alignment may be iterative, where the composite contour 304 is moved relative to the reference contour within a certain range such that the contour-to-contour difference is minimized. For example, FIG. 9B illustrates an example alignment of a composite contour 904 to a reference contour 901 comprising four contact holes and a vertical line. A reference contour 901 has a center 901c, and averaged contour 904 has a center 904c. The composite contour 904 is also associated with a pre-defined range 910 for movement/shifting of the averaged contour 904. In an embodiment, the contour-to-contour difference includes a distance 912, which may be progressively reduced, e.g., minimized by moving (e.g., to left) the averaged contour 904 within the predefined range 910. In an embodiment, the contour-to-contour distance may be with respect to an edge of the reference contour and a corresponding edge of the composite contour.

In an embodiment, the contour-to-contour difference is an absolute error value (e.g., sum of EPE at different gauge points). In an embodiment, the contour-contour difference may be expressed in terms of an angle, such as cut-line angles at curved portions (e.g., see FIG. 5 cut-lines CL1 and CL5).

Further, the process 900, in step P903, involves a second alignment, for example, to minimize a contour-to-contour difference in a particular direction e.g., a misalignment error in X and/or Y direction.

In an embodiment, an apparatus may be configured to extract contours based on the measurement data 319 (e.g., the stochastic variation). In an embodiment, such extract can be real-time, for example, a metrology tool deployed in a high-volume manufacturing (HVM) setup. In an embodiment, the metrology tool comprises, for example, a processor 104 implementing the method 300 or just receive a pre-determined SEPE. Furthermore, the apparatus may be configured to update (via a processor), e.g., SEPE band, based on new images. Before updating, a contour can be extracted from the new image, as discussed in method 300, e.g., in process P305.

In an embodiment, an apparatus is configured to extract a contour from a metrology or raw image, the apparatus comprising a processor (e.g., processor 104) configured to: obtain (i) the metrology image of a substrate having a printed pattern, (ii) an averaged image of the printed pattern, (iii) extract a composite contour from the average image, (iv) align the composite contour to the reference pattern, (v), extract raw contours from the raw images, (vi) measure the raw contours based on pre-placed cut-lines, and (vii) extract the measurement statics such as intra-die variation, inter-die variation and intra-image FOV variation, i.e. stochastic variation a $\sigma_{sepe}$.

In an embodiment, extracting of the contour from raw images involves using a point on the composite contour from the averaged image as a starting point and using a normal direction angle of the point from D2DB alignment of the composite contour to reference contour as the direction for contour edge finding, and determining raw contour edge position. In an embodiment, the processor is further configured to determine, based on the extracted contour, a pattern measurement (e.g., as discussed earlier in the method 300).

In some embodiments, a scanning electron microscope (SEM) yields an image of a structure (e.g., some or all the structure of a device) exposed or transferred on the substrate. FIG. 10 depicts an embodiment of a SEM 200. A primary electron beam 202 emitted from an electron source 201 is converged by condenser lens 203 and then passes through a beam deflector 204, an ExB deflector 205, and an objective lens 206 to irradiate a substrate 100 on a substrate table 101 at a focus.

When the substrate 100 is irradiated with electron beam 202, secondary electrons are generated from the substrate 100. The secondary electrons are deflected by the ExB deflector 205 and detected by a secondary electron detector 207. A two-dimensional electron beam image can be obtained by detecting the electrons generated from the sample in synchronization with, e.g., two dimensional scanning of the electron beam by beam deflector 204 or with repetitive scanning of electron beam 202 by beam deflector 204 in an X or Y direction, together with continuous movement of the substrate 100 by the substrate table 101 in the other of the X or Y direction.

A signal detected by secondary electron detector 207 is converted to a digital signal by an analog/digital (A/D) converter 208, and the digital signal is sent to an image processing system 300. In an embodiment, the image processing system 300 may have memory 303 to store all or part of digital images for processing by a processing unit 304. The processing unit 304 (e.g., specially designed hardware or a combination of hardware and software) is configured to convert or process the digital images into datasets representative of the digital images. Further, image processing system 300 may have a storage medium 301 configured to store the digital images and corresponding datasets in a reference database. A display device 302 may be connected with the image processing system 300, so that an operator can conduct necessary operation of the equipment with the help of a graphical user interface.

Figure 18:
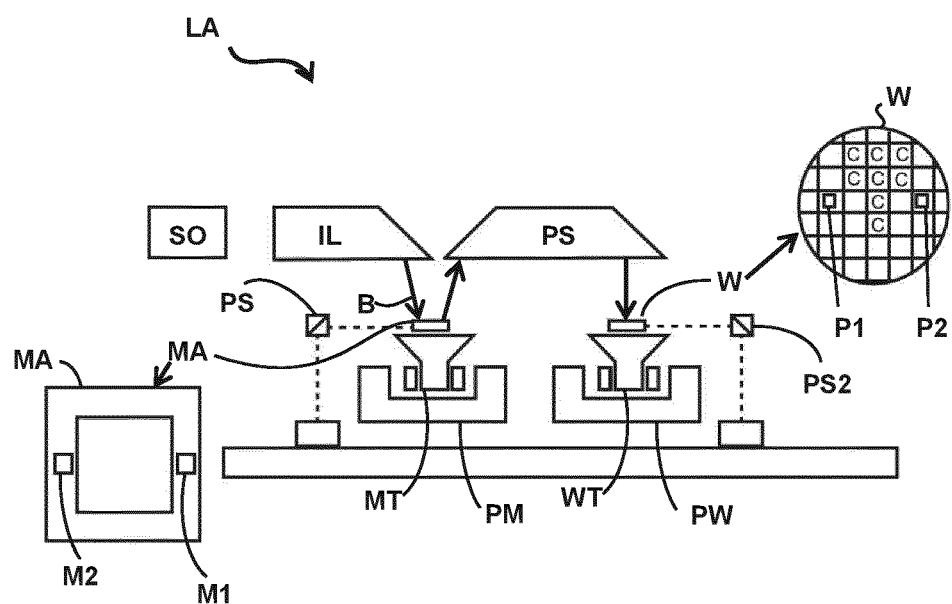
FIG. 18 is a schematic diagram of another lithographic projection apparatus, according to an embodiment.

FIG. 18 schematically illustrates a further embodiment of an inspection apparatus. The system is used to inspect a sample 90 (such as a substrate) on a sample stage 89 and comprises a charged particle beam generator 81, a condenser lens module 82, a probe forming objective lens module 83, a charged particle beam deflection module 84, a secondary charged particle detector module 85, and an image forming module 86.

The charged particle beam generator 81 generates a primary charged particle beam 91. The condenser lens module 82 condenses the generated primary charged particle beam 91. The probe forming objective lens module 83 focuses the condensed primary charged particle beam into a charged particle beam probe 92. The charged particle beam deflection module 84 scans the formed charged particle beam probe 92 across the surface of an area of interest on the sample 90 secured on the sample stage 89. In an embodiment, the charged particle beam generator 81, the condenser lens module 82 and the probe forming objective lens module 83, or their equivalent designs, alternatives or any combination thereof, together form a charged particle beam probe generator which generates the scanning charged particle beam probe 92.

The secondary charged particle detector module 85 detects secondary charged particles 93 emitted from the sample surface (maybe also along with other reflected or scattered charged particles from the sample surface) upon being bombarded by the charged particle beam probe 92 to generate a secondary charged particle detection signal 94. The image forming module 86 (e.g., a computing device) is coupled with the secondary charged particle detector module 85 to receive the secondary charged particle detection signal 94 from the secondary charged particle detector module 85 and accordingly forming at least one scanned image. In an embodiment, the secondary charged particle detector module 85 and image forming module 86, or their equivalent designs, alternatives or any combination thereof, together form an image forming apparatus which forms a scanned image from detected secondary charged particles emitted from sample 90 being bombarded by the charged particle beam probe 92.

As noted above, SEM images may be processed to extract contours that describe the edges of objects, representing device structures, in the image. These contours are then quantified via metrics, such as CD. Thus, typically, the images of device structures are compared and quantified via simplistic metrics, such as an edge-to-edge distance (CD) or simple pixel differences between images. Typical contour models that detect the edges of the objects in an image in order to measure CD use image gradients. Indeed, those models rely on strong image gradients. But, in practice, the image typically is noisy and has discontinuous boundaries. Techniques, such as smoothing, adaptive thresholding, edge-detection, erosion, and dilation, may be used to process the results of the image gradient contour models to address noisy and discontinuous images, but will ultimately result in a low-resolution quantification of a high-resolution image. Thus, in most instances, mathematical manipulation of images of device structures to reduce noise and automate edge detection results in loss of resolution of the image, thereby resulting in loss of information. Consequently, the result is a low-resolution quantification that amounts to a simplistic representation of a complicated, high-resolution structure.

So, it is desirable to have a mathematical representation of the structures (e.g., circuit features, alignment mark or metrology target portions (e.g., grating features), etc.) produced or expected to be produced using a patterning process, whether, e.g., the structures are in a latent resist image, in a developed resist image or transferred to a layer on the substrate, e.g., by etching, that can preserve the resolution and yet describe the general shape of the structures. In the context of lithography or other pattering processes, the structure may be a device or a portion thereof that is being manufactured and the images may be SEM images of the structure. In some instances, the structure may be a feature of semiconductor device, e.g., integrated circuit. In some instances, the structure may be an alignment mark, or a portion thereof (e.g., a grating of the alignment mark), that is used in an alignment measurement process to determine alignment of an object (e.g., a substrate) with another object (e.g., a patterning device) or a metrology target, or a portion thereof (e.g., a grating of the metrology target), that is used to measure a parameter (e.g., overlay, focus, dose, etc.) of the patterning process. In an embodiment, the metrology target is a diffractive grating used to measure, e.g., overlay.

In an embodiment, the measurement data (e.g., stochastic variations) related to the printed pattern, determined according to the method of FIG. 3, may be employed in optimization of patterning process or adjusting parameters of the patterning process. As an example, OPC addresses the fact that the final size and placement of an image of the design layout projected on the substrate will not be identical to, or simply depend only on the size and placement of the design layout on the patterning device. It is noted that the terms "mask", "reticle", "patterning device" are utilized interchangeably herein. Also, person skilled in the art will recognize that, especially in the context of lithography simulation/optimization, the term "mask"/"patterning device" and "design layout" can be used interchangeably, as in lithography simulation/optimization, a physical patterning device is not necessarily used but a design layout can be used to represent a physical patterning device. For the small feature sizes and high feature densities present on some design layout, the position of a particular edge of a given feature will be influenced to a certain extent by the presence or absence of other adjacent features. These proximity effects arise from minute amounts of radiation coupled from one feature to another and/or non-geometrical optical effects such as diffraction and interference. Similarly, proximity effects may arise from diffusion and other chemical effects during post-exposure bake (PEB), resist development, and etching that generally follow lithography.

In order to ensure that the projected image of the design layout is in accordance with requirements of a given target circuit design, proximity effects need to be predicted and compensated for, using sophisticated numerical models, corrections or pre-distortions of the design layout. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design almost every feature of the design layout has some modification in order to achieve high fidelity of the projected image to the target design. These modifications may include shifting or biasing of edge positions or line widths as well as application of "assist" features that are intended to assist projection of other features.

Application of model-based OPC to a target design involves good process models and considerable computational resources, given the many millions of features typically present in a chip design. However, applying OPC is generally not an "exact science", but an empirical, iterative process that does not always compensate for all possible proximity effect. Therefore, effect of OPC, e.g., design layouts after application of OPC and any other RET, need to be verified by design inspection, i.e. intensive full-chip simulation using calibrated numerical process models, in order to minimize the possibility of design flaws being built into the patterning device pattern. This is driven by the enormous cost of making high-end patterning devices, which run in the multi-million dollar range, as well as by the impact on turn-around time by reworking or repairing actual patterning devices once they have been manufactured.

Both OPC and full-chip RET verification may be based on numerical modeling systems and methods as described, for example in, U.S. patent application Ser. No. 10/815,573 and an article titled "Optimized Hardware and Software For Fast, Full Chip Simulation", by Y. Cao et al., Proc. SPIE, Vol. 5754, 405 (2005).

One RET is related to adjustment of the global bias of the design layout. The global bias is the difference between the patterns in the design layout and the patterns intended to print on the substrate. For example, a circular pattern of 25 nm diameter may be printed on the substrate by a 50 nm diameter pattern in the design layout or by a 20 nm diameter pattern in the design layout but with high dose.

In addition to optimization to design layouts or patterning devices (e.g., OPC), the illumination source can also be optimized, either jointly with patterning device optimization or separately, in an effort to improve the overall lithography fidelity. The terms "illumination source" and "source" are used interchangeably in this document. Since the 1990s, many off-axis illumination sources, such as annular, quadrupole, and dipole, have been introduced, and have provided more freedom for OPC design, thereby improving the imaging results, As is known, off-axis illumination is a proven way to resolve fine structures (i.e., target features) contained in the patterning device. However, when compared to a traditional illumination source, an off-axis illumination source usually provides less radiation intensity for the aerial image (AI). Thus, it becomes desirable to attempt to optimize the illumination source to achieve the optimal balance between finer resolution and reduced radiation intensity.

Numerous illumination source optimization approaches can be found, for example, in an article by Rosenbluth et al., titled "Optimum Mask and Source Patterns to Print A Given Shape", Journal of Microlithography, Microfabrication, Microsystems 1(1), pp. 13-20, (2002). The source is partitioned into several regions, each of which corresponds to a certain region of the pupil spectrum. Then, the source distribution is assumed to be uniform in each source region and the brightness of each region is optimized for process window. However, such an assumption that the source distribution is uniform in each source region is not always valid, and as a result the effectiveness of this approach suffers. In another example set forth in an article by Granik, titled "Source Optimization for Image Fidelity and Throughput", Journal of Microlithography, Microfabrication, Microsystems 3(4), pp. 509-522, (2004), several existing source optimization approaches are overviewed and a method based on illuminator pixels is proposed that converts the source optimization problem into a series of non-negative least square optimizations. Though these methods have demonstrated some successes, they typically require multiple complicated iterations to converge. In addition, it may be difficult to determine the appropriate/optimal values for some extra parameters, such as $\gamma$ in Granik's method, which dictates the trade-off between optimizing the source for substrate image fidelity and the smoothness requirement of the source.

For low $k_1$ photolithography, optimization of both the source and patterning device is useful to ensure a viable process window for projection of critical circuit patterns. Some algorithms (e.g. Socha et. al. Proc. SPIE vol. 5853, 2005, p. 180) discretize illumination into independent source points and mask into diffraction orders in the spatial frequency domain, and separately formulate a cost function (which is defined as a function of selected design variables) based on process window metrics such as exposure latitude which could be predicted by optical imaging models from source point intensities and patterning device diffraction orders. The term "design variables" as used herein comprises a set of parameters of a lithographic projection apparatus or a lithographic process, for example, parameters a user of the lithographic projection apparatus can adjust, or image characteristics a user can adjust by adjusting those parameters. It should be appreciated that any characteristics of a lithographic projection process, including those of the source, the patterning device, the projection optics, and/or resist characteristics can be among the design variables in the optimization. The cost function is often a non-linear function of the design variables. Then standard optimization techniques are used to minimize the cost function.

Relatedly, the pressure of ever decreasing design rules have driven semiconductor chipmakers to move deeper into the low $k_1$ lithography era with existing 193 nm ArF lithography. Lithography towards lower $k_1$ puts heavy demands on RET, exposure tools, and the need for litho-friendly design. 1.35 ArF hyper numerical aperture (NA) exposure tools may be used in the future. To help ensure that circuit design can be produced on to the substrate with workable process window, source-patterning device optimization (referred to herein as source-mask optimization or SMO) is becoming a significant RET for 2× nm node.

A source and patterning device (design layout) optimization method and system that allows for simultaneous optimization of the source and patterning device using a cost function without constraints and within a practicable amount of time is described in a commonly assigned International Patent Application No. PCT/US2009/065359, filed on Nov. 20, 2009, and published as WO2010/059954, titled "Fast Freeform Source and Mask Co-Optimization Method", which is hereby incorporated by reference in its entirety.

Another source and mask optimization method and system that involves optimizing the source by adjusting pixels of the source is described in a commonly assigned U.S. patent application Ser. No. 12/813,456, filed on Jun. 10, 2010, and published as U.S. Patent Application Publication No. 2010/0315614, titled "Source-Mask Optimization in Lithographic Apparatus", which is hereby incorporated by reference in its entirety.

In a lithographic projection apparatus, as an example, a cost function is expressed as $$CF(z_1, z_2, \ldots, z_N) = \sum_{p=1}^{P} w_p f_p^2(z_1, z_2, \ldots, z_N) \quad \text{(Eq. 1)}$$

wherein $(z_1, z_2, \ldots, z_N)$ are N design variables or values thereof. $f_p(z_1, z_2, \ldots, z_N)$ can be a function of the design variables $(z_1, z_2, \ldots, z_N)$ such as a difference between an actual value and an intended value of a characteristic at an evaluation point for a set of values of the design variables of $(z_1, z_2, \ldots, z_N)$. $w_p$ is a weight constant associated with $f_p(z_1, z_2, \ldots, z_N)$. An evaluation point or pattern more critical than others can be assigned a higher $w_p$ value. Patterns and/or evaluation points with larger number of occurrences may be assigned a higher $w_p$ value, too. Examples of the evaluation points can be any physical point or pattern on the substrate, any point on a virtual design layout, or resist image, or aerial image, or a combination thereof. $f_p(z_1, z_2, \ldots, z_N)$ can also be a function of one or more stochastic effects such as the LWR, which are functions of the design variables $(z_1, z_2, \ldots, z_N)$. The cost function may represent any suitable characteristics of the lithographic projection apparatus or the substrate, for instance, failure rate of a feature, focus, CD, image shift, image distortion, image rotation, stochastic effects, throughput, CDU, or a combination thereof. CDU is local CD variation (e.g., three times of the standard deviation of the local CD distribution). CDU may be interchangeably referred to as LCDU. In one embodiment, the cost function represents (i.e., is a function of) CDU, throughput, and the stochastic effects. In one embodiment, the cost function represents (i.e., is a function of) EPE, throughput, and the stochastic effects. In one embodiment, the design variables $(z_1, z_2, \ldots, z_N)$ comprise dose, global bias of the patterning device, shape of illumination from the source, or a combination thereof. Since it is the resist image that often dictates the circuit pattern on a substrate, the cost function often includes functions that represent some characteristics of the resist image. For example, $f_p(z_1, z_2, \ldots, z_N)$ of such an evaluation point can be simply a distance between a point in the resist image to an intended position of that point (i.e., edge placement error $EPE_p(z_1, z_2, \ldots, z_N)$). The design variables can be any adjustable parameters such as adjustable parameters of the source, the patterning device, the projection optics, dose, focus, etc. The projection optics may include components collectively called as "wavefront manipulator" that can be used to adjust shapes of a wavefront and intensity distribution and/or phase shift of the irradiation beam. The projection optics preferably can adjust a wavefront and intensity distribution at any location along an optical path of the lithographic projection apparatus, such as before the patterning device, near a pupil plane, near an image plane, near a focal plane. The projection optics can be used to correct or compensate for certain distortions of the wavefront and intensity distribution caused by, for example, the source, the patterning device, temperature variation in the lithographic projection apparatus, thermal expansion of components of the lithographic projection apparatus. Adjusting the wavefront and intensity distribution can change values of the evaluation points and the cost function. Such changes can be simulated from a model or actually measured. Of course, $CF(z_1, z_2, \ldots, z_N)$ is not limited the form in Eq. 1. $CF(z_1, z_2, \ldots, z_N)$ can be in any other suitable form.

It should be noted that the normal weighted root mean square (RMS) of $f_p(z_1, z_2, \ldots, z_N)$ is defined as $$\sqrt{\frac{1}{P}\sum_{p=1}^{P} w_p f_p^2(z_1, z_2, \ldots, z_N)},$$

therefore, minimizing the weighted RMS of $f_p(z_1, z_2, \ldots, z_N)$ is equivalent to minimizing the cost function $$CF(z_1, z_2, \ldots, z_N) = \sum_{p=1}^{P} w_p f_p^2(z_1, z_2, \ldots, z_N),$$

defined in Eq. 1. Thus the weighted RMS of $f_p(z_1, z_2, \ldots, z_N)$ and Eq. 1 may be utilized interchangeably for notational simplicity herein.

Further, if considering maximizing the PW (Process Window), one can consider the same physical location from different PW conditions as different evaluation points in the cost function in (Eq.1). For example, if considering N PW conditions, then one can categorize the evaluation points according to their PW conditions and write the cost functions as:

$$CF(z_1, z_2, \ldots, z_N) = \qquad \text{(Eq. 1')}$$
$$\sum_{p=1}^{P} w_p f_p^2(z_1, z_2, \ldots, z_N) = \sum_{u=1}^{U}\sum_{p_u=1}^{P_u} w_{p_u} f_{p_u}^2(z_1, z_2, \ldots, z)$$

Where $f_{p_u}(z_1, z_2, \ldots, z_N)$ is the value of $f_p(z_1, z_2, \ldots, z_N)$ under the u-th PW condition $u=1, \ldots, U$. When $f_p(z_1, z_2, \ldots, z_N)$ is the EPE, then minimizing the above cost function is equivalent to minimizing the edge shift under various PW conditions, thus this leads to maximizing the PW. In particular, if the PW also consists of different mask bias, then minimizing the above cost function also includes the minimization of MEEF (Mask Error Enhancement Factor), which is defined as the ratio between the substrate EPE and the induced mask edge bias.

The design variables may have constraints, which can be expressed as $(z_1, z_2, \ldots, z_N) \in Z$, where Z is a set of possible values of the design variables. One possible constraint on the design variables may be imposed by yield or a desired throughput of the lithographic projection apparatus. The desired yield or throughput may limit the dose and thus has implications for the stochastic effects (e.g., imposing a lower bound on the stochastic effects). Higher throughput generally leads to lower dose, shorter longer exposure time and greater stochastic effects. Higher yield generally leads to a restricted design which may be sensitive to stochastic risk. Consideration of substrate throughput, yield and minimization of the stochastic effects may constrain the possible values of the design variables because the stochastic effects are function of the design variables. Without such a constraint imposed by the desired throughput, the optimization may yield a set of values of the design variables that are unrealistic. For example, if the dose is among the design variables, without such a constraint, the optimization may yield a dose value that makes the throughput economically impossible. However, the usefulness of constraints should not be interpreted as a necessity. The throughput may be affected by the failure rate based adjustment to parameters of the patterning process. It is desirable to have lower failure rate of the feature while maintaining a high throughput. Throughput may also be affected by the resist chemistry. Slower resist (e.g., a resist that requires higher amount of light to be properly exposed) leads to lower throughput. Thus, based on the optimization process involving failure rate of a feature due to resist chemistry or fluctuations, and dose requirements for higher throughput, appropriate parameters of the patterning process may be determined.

The optimization process therefore is to find a set of values of the design variables, under the constraints $(z_1, z_2, \ldots, z_N) \in Z$, that minimize the cost function, i.e., to find $$(\tilde{z}_1, \tilde{z}_2, \ldots \tilde{z}_N) = \underset{(z_1, z_2, \ldots, z_N) \in Z}{\operatorname{argmin}} CF(z_1, z_2, \ldots, z_N) = \qquad \text{(Eq. 2)}$$
$$\underset{(z_1, z_2, \ldots, z_N) \in Z}{\operatorname{argmin}} \sum_{p=1}^{P} w_p f_p^2(z_1, z_2, \ldots, z_N)$$

Figure 12:
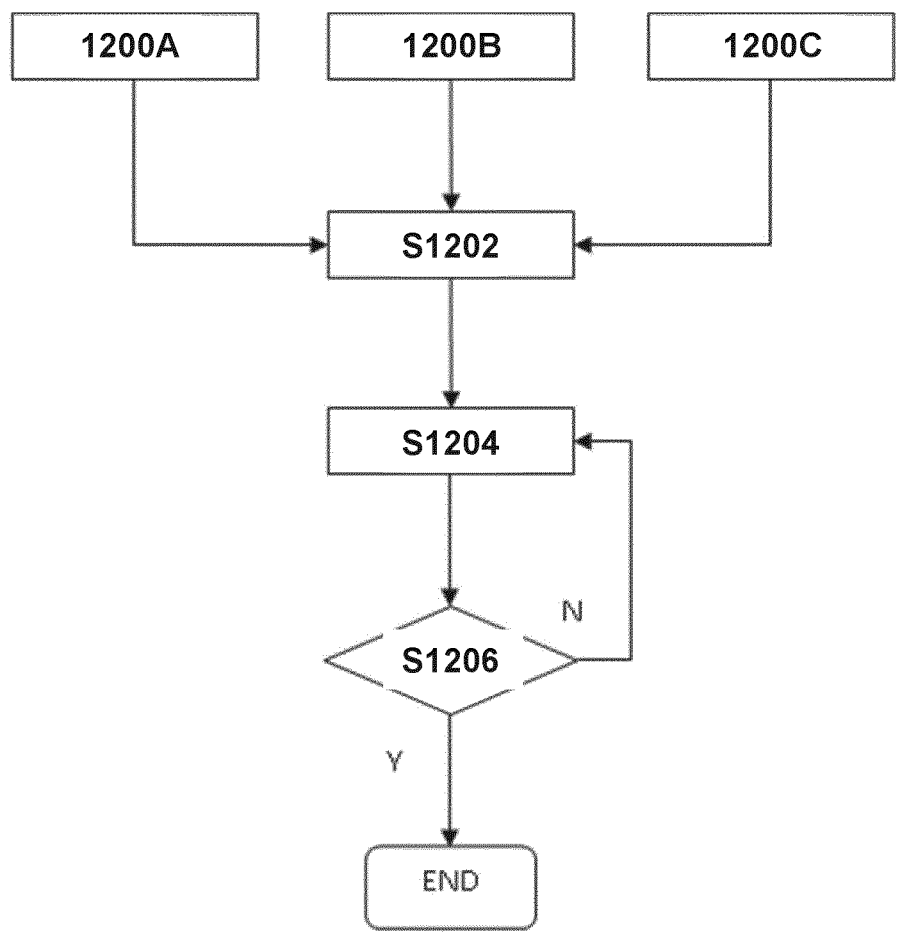
FIG. 12 is a flow diagram illustrating aspects of an example methodology of joint optimization, according to an embodiment.

A general method of optimizing the lithography projection apparatus, according to an embodiment, is illustrated in FIG. 12. This method comprises a step S1202 of defining a multi-variable cost function of a plurality of design variables. The design variables may comprise any suitable combination selected from characteristics of the illumination source (1200A) (e.g., pupil fill ratio, namely percentage of radiation of the source that passes through a pupil or aperture), characteristics of the projection optics (1200B) and characteristics of the design layout (1200C). For example, the design variables may include characteristics of the illumination source (1200A) and characteristics of the design layout (1200C) (e.g., global bias) but not characteristics of the projection optics (1200B), which leads to an SMO. Alternatively, the design variables may include characteristics of the illumination source (1200A), characteristics of the projection optics (1200B) and characteristics of the design layout (1200C), which leads to a source-mask-lens optimization (SMLO). In step S1204, the design variables are simultaneously adjusted so that the cost function is moved towards convergence. In step S1206, it is determined whether a predefined termination condition is satisfied. The predetermined termination condition may include various possibilities, i.e. the cost function may be minimized or maximized, as required by the numerical technique used, the value of the cost function has been equal to a threshold value or has crossed the threshold value, the value of the cost function has reached within a preset error limit, or a preset number of iteration is reached. If either of the conditions in step S1206 is satisfied, the method ends. If none of the conditions in step S1206 is satisfied, the step S1204 and S1206 are iteratively repeated until a desired result is obtained. The optimization does not necessarily lead to a single set of values for the design variables because there may be physical restraints caused by factors such as the failure rates, the pupil fill factor, the resist chemistry, the throughput, etc. The optimization may provide multiple sets of values for the design variables and associated performance characteristics (e.g., the throughput) and allows a user of the lithographic apparatus to pick one or more sets.

In a lithographic projection apparatus, the source, patterning device and projection optics can be optimized alternatively (referred to as Alternative Optimization) or optimized simultaneously (referred to as Simultaneous Optimization). The terms "simultaneous", "simultaneously", "joint" and "jointly" as used herein mean that the design variables of the characteristics of the source, patterning device, projection optics and/or any other design variables, are allowed to change at the same time. The term "alternative" and "alternatively" as used herein mean that not all of the design variables are allowed to change at the same time.

Figure 13:
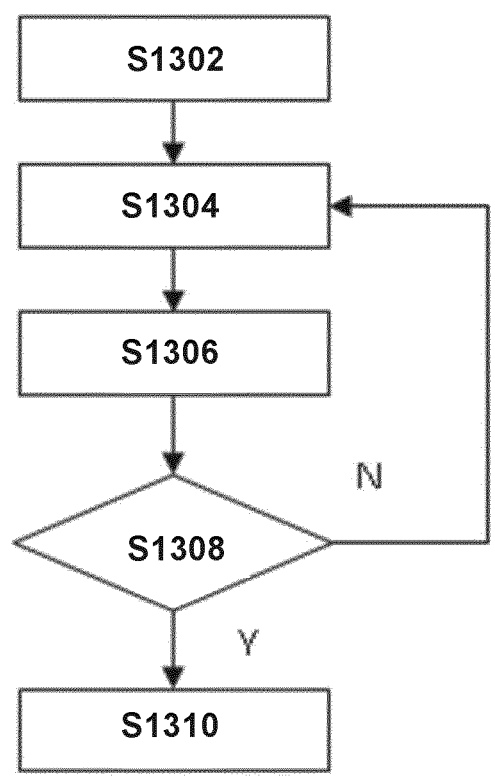
FIG. 13 shows an embodiment of another optimization method, according to an embodiment.

In FIG. 13, the optimization of all the design variables is executed simultaneously. Such flow may be called the simultaneous flow or co-optimization flow. Alternatively, the optimization of all the design variables is executed alternatively, as illustrated in FIG. 13. In this flow, in each step, some design variables are fixed while the other design variables are optimized to minimize the cost function; then in the next step, a different set of variables are fixed while the others are optimized to minimize the cost function. These steps are executed alternatively until convergence or certain terminating conditions are met.

As shown in the non-limiting example flowchart of FIG. 13, first, a design layout (step S1302) is obtained, then a step of source optimization is executed in step S1304, where all the design variables of the illumination source are optimized (SO) to minimize the cost function while all the other design variables are fixed. Then in the next step S1306, a mask optimization (MO) is performed, where all the design variables of the patterning device are optimized to minimize the cost function while all the other design variables are fixed. These two steps are executed alternatively, until certain terminating conditions are met in step S1308. Various termination conditions can be used, such as, the value of the cost function becomes equal to a threshold value, the value of the cost function crosses the threshold value, the value of the cost function reaches within a preset error limit, or a preset number of iteration is reached, etc. Note that SO-MO-Alternative-Optimization is used as an example for the alternative flow. The alternative flow can take many different forms, such as SO-LO-MO-Alternative-Optimization, where SO, LO (Lens Optimization) is executed, and MO alternatively and iteratively; or first SMO can be executed once, then execute LO and MO alternatively and iteratively; and so on. Finally the output of the optimization result is obtained in step S1310, and the process stops.

The pattern selection algorithm, as discussed before, may be integrated with the simultaneous or alternative optimization. For example, when an alternative optimization is adopted, first a full-chip SO can be performed, the 'hot spots' and/or 'warm spots' are identified, then an MO is performed. In view of the present disclosure numerous permutations and combinations of sub-optimizations are possible in order to achieve the desired optimization results.

Figure 14A:
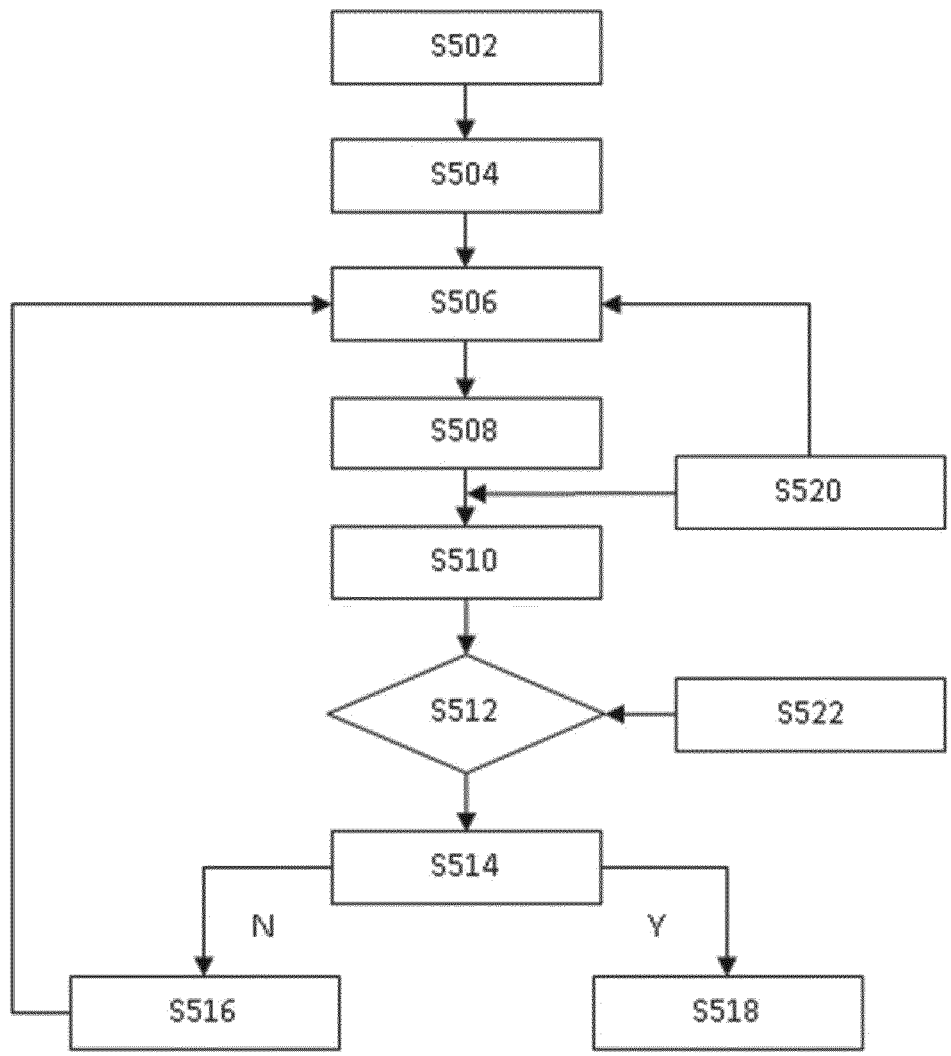
FIGS. 14A, 14B and 15 show example flowcharts of various optimization processes, according to an embodiment.

FIG. 14A shows one exemplary method of optimization, where a cost function is minimized. In step S502, initial values of design variables are obtained, including their tuning ranges, if any. In step S504, the multi-variable cost function is set up. In step S506, the cost function is expanded within a small enough neighborhood around the starting point value of the design variables for the first iterative step (i=0). In step S508, standard multi-variable optimization techniques are applied to minimize the cost function. Note that the optimization problem can apply constraints, such as tuning ranges, during the optimization process in S508 or at a later stage in the optimization process. Step S520 indicates that each iteration is done for the given test patterns (also known as "gauges") for the identified evaluation points that have been selected to optimize the lithographic process. In step S510, a lithographic response is predicted. In step S512, the result of step S510 is compared with a desired or ideal lithographic response value obtained in step S522. If the termination condition is satisfied in step S514, i.e. the optimization generates a lithographic response value sufficiently close to the desired value, and then the final value of the design variables is outputted in step S518. The output step may also include outputting other functions using the final values of the design variables, such as outputting a wavefront aberration-adjusted map at the pupil plane (or other planes), an optimized source map, and optimized design layout etc. If the termination condition is not satisfied, then in step S516, the values of the design variables is updated with the result of the i-th iteration, and the process goes back to step S506. The process of FIG. 14A is elaborated in details below.

In an exemplary optimization process, no relationship between the design variables $(z_1, z_2, \ldots, z_N)$ and $f_p(z_1, z_2, \ldots, z_N)$ is assumed or approximated, except that $f_p(z_1, z_2, \ldots, z_N)$ is sufficiently smooth (e.g. first order derivatives $$\frac{\partial f_p(z_1, z_2, \ldots, z_N)}{\partial z_n},$$

(n=1, 2, ... N) exist), which is generally valid in a lithographic projection apparatus. An algorithm, such as the Gauss-Newton algorithm, the Levenberg-Marquardt algorithm, the gradient descent algorithm, simulated annealing, the genetic algorithm, can be applied to find $(\tilde{z}_1, \tilde{z}_2, \ldots \tilde{z}_N)$.

Here, the Gauss-Newton algorithm is used as an example. The Gauss-Newton algorithm is an iterative method applicable to a general non-linear multi-variable optimization problem. In the i-th iteration wherein the design variables $(z_1, z_2, \ldots, z_N)$ take values of $(z_{1i}, z_{2i}, \ldots, z_{Ni})$, the Gauss-Newton algorithm linearizes $f_p(z_1, z_2, \ldots, z_N)$ in the vicinity of $(z_{1i}, z_{2i}, \ldots, z_{Ni})$, and then calculates values $(z_{1(i+1)}, z_{2(i+1)}, \ldots, z_{N(i+1)})$ in the vicinity of $(z_{1i}, z_{2i}, \ldots, z_{Ni})$ that give a minimum of $CF(z_1, z_2, \ldots, z_N)$. The design variables $(z_1, z_2, \ldots, z_N)$ take the values of $(z_{1(i+1)}, z_{2(i+1)}, \ldots, z_N)$ in the (i+1)-th iteration. This iteration continues until convergence (i.e. $CF(z_1, z_2, \ldots, z_N)$ does not reduce any further) or a preset number of iterations is reached.

Specifically, in the i-th iteration, in the vicinity of $(z_{1i}, z_{2i}, \ldots, z_{Ni})$, $$f_p(z_1, z_2, \ldots, z_N) \approx f_p(z_{1i}, z_{2i}, \ldots, z_{Ni}) + \sum_{n=1}^{N} \left. \frac{\partial f_p(z_1, z_2, \ldots, z_N)}{\partial z_n} \right|_{z_1=z_{1i}, z_2=z_{2i}, \ldots, z_N=z_{Ni}} (z_n - z_{ni}) \quad \text{(Eq. 3)}$$

Under the approximation of Eq. 3, the cost function becomes:

$$CF(z_1, z_2, \ldots, z_N) = \sum_{p=1}^{P} w_p f_p^2(z_1, z_2, \ldots, z_N) = \sum_{p=1}^{P} w_p \left( f_p(z_1, z_2, \ldots, z_N) + \sum_{n=1}^{N} \left. \frac{\partial f_p(z_1, z_2, \ldots, z_N)}{\partial z_n} \right|_{z_1=z_{1i}, z_2=z_{2i}, \ldots, z_N=z_{Ni}} (z_n - z_{ni}) \right)^2 \quad \text{(Eq. 4)}$$

which is a quadratic function of the design variables $(z_1, z_2, \ldots, z_N)$. Every term is constant except the design variables $(z_1, z_2, \ldots, z_N)$.

If the design variables $(z_1, z_2, \ldots, z_N)$ are not under any constraints, $(z_{1(i+1)}, z_{2(i+1)}, \ldots, z_{N(i+1)})$ can be derived by solving by N linear equations:

$$\frac{\partial CF(z_1, z_2, \ldots, z_N)}{\partial z_n} = 0,$$

wherein $n=1, 2, \ldots N$.

If the design variables $(z_1, z_2, \ldots, z_N)$ are under the constraints in the form of J inequalities (e.g. tuning ranges of $$(z_1, z_2, \ldots, z_N)) \sum_{n=1}^{N} A_{nj} z_n \leq B_j,$$

for $j\ 1, 2, \ldots J$; and K equalities (e.g. interdependence between the design variables)

$$\sum_{n=1}^{N} C_{nk} z_n = D_k,$$

for $k=1, 2, \ldots K$; the optimization process becomes a classic quadratic programming problem, wherein $A_{nj}, B_j, C_{nk}, D_k$ are constants. Additional constraints can be imposed for each iteration. For example, a "damping factor" $\Delta_D$ can be introduced to limit the difference between $(z_{1(i+1)}, z_{2(i+1)}, \ldots, z_{N(i+1)})$ and $(z_{1i}, z_{2i}, \ldots, z_{Ni})$, so that the approximation of Eq. 3 holds. Such constraints can be expressed as $z_{ni} - \Delta_D \leq z_n \leq z_{ni} + \Delta_D$ $(z_{1(i+1)}, z_{2(i+1)}, \ldots, z_{N(i+1)})$ can be derived using, for example, methods described in Numerical Optimization ($2^{nd}$ ed.) by Jorge Nocedal and Stephen J. Wright (Berlin N.Y.: Vandenberghe. Cambridge University Press).

Instead of minimizing the RMS of $f_p(z_1, z_2, \ldots, z_N)$, the optimization process can minimize magnitude of the largest deviation (the worst defect) among the evaluation points to their intended values. In this approach, the cost function can alternatively be expressed as $$CF(z_1, z_2, \ldots, z_N) = \max_{1 \leq p \leq P} \frac{f_p(z_1, z_2, \ldots, z_N)}{CL_p}, \quad \text{(Eq. 5)}$$

wherein $CL_p$ is the maximum allowed value for $f_p(z_1, z_2, \ldots, z_N)$. This cost function represents the worst defect among the evaluation points. Optimization using this cost function minimizes magnitude of the worst defect. An iterative greedy algorithm can be used for this optimization.

The cost function of Eq. 5 can be approximated as:

$$CF(z_1, z_2, \ldots, z_N) = \sum_{p=1}^{P} \left( \frac{f_p(z_1, z_2, \ldots, z_N)}{CL_p} \right)^q, \quad \text{(Eq. 6)}$$

wherein q is an even positive integer such as at least 4, preferably at least 10. Eq. 6 mimics the behavior of Eq. 5, while allowing the optimization to be executed analytically and accelerated by using methods such as the deepest descent method, the conjugate gradient method, etc.

Minimizing the worst defect size can also be combined with linearizing of $f_p(z_1, z_2, \ldots, z_N)$. Specifically, $f_p(z_1, z_2, \ldots, z_N)$ is approximated as in Eq. 3. Then the constraints on worst defect size are written as inequalities $E_{Lp} \leq f_p(z_1, z_2, \ldots, z_N) \leq E_{Up}$ wherein $E_{Lp}$ and $E_{Up}$ are two constants specifying the minimum and maximum allowed deviation for the $f_p(z_1, z_2, \ldots, z_N)$. Plugging Eq. 3 in, these constraints are transformed to, for $p=1, \ldots P$, $$\sum_{n=1}^{N} \left. \frac{\partial f_p(z_1, z_2, \ldots, z_N)}{\partial z_n} \right|_{z_1=z_{1i}, z_2=z_{2i}, \ldots, z_N=z_{Ni}} z_n \leq E_{Up} + \sum_{n=1}^{N} \left. \frac{\partial f_p(z_1, z_2, \ldots, z_N)}{\partial z_n} \right|_{z_1=z_{1i}, z_2=z_{2i}, \ldots, z_N=z_{Ni}} z_{ni} - f_p(z_{1i}, z_{2i}, z_{Ni}) \quad \text{(Eq. 6')}$$

and $$-\sum_{n=1}^{N} \left. \frac{\partial f_p(z_1, z_2, \ldots, z_N)}{\partial z_n} \right|_{z_1=z_{1i}, z_2=z_{2i}, \ldots, z_N=z_{Ni}} z_n \leq -E_{Up} - \sum_{n=1}^{N} \left. \frac{\partial f_p(z_1, z_2, \ldots, z_N)}{\partial z_n} \right|_{z_1=z_{1i}, z_2=z_{2i}, \ldots, z_N=z_{Ni}} z_{ni} + f_p(z_{1i}, z_{2i}, \ldots, z_{Ni}) \quad \text{(Eq. 6'')}$$

Since Eq. 3 is generally valid only in the vicinity of $(z_{1i}, z_{2i}, \ldots, z_{Ni})$, in case the desired constraints $E_{Lp} \leq f_p(z_1, z_2, \ldots, z_N) \leq E_{Up}$ cannot be achieved in such vicinity, which can be determined by any conflict among the inequalities, the constants $E_{Lp}$ and $E_{Up}$ can be relaxed until the constraints are achievable. This optimization process minimizes the worst defect size in the vicinity of $(z_{1i}, z_{2i}, \ldots, z_{Ni})$. Then each step reduces the worst defect size gradually, and each step is executed iteratively until certain terminating conditions are met. This will lead to optimal reduction of the worst defect size.

Another way to minimize the worst defect is to adjust the weight $w_p$ in each iteration. For example, after the i-th iteration, if the r-th evaluation point is the worst defect, $w_r$ can be increased in the (i+1)-th iteration so that the reduction of that evaluation point's defect size is given higher priority.

In addition, the cost functions in Eq.4 and Eq.5 can be modified by introducing a Lagrange multiplier to achieve compromise between the optimization on RMS of the defect size and the optimization on the worst defect size, i.e., $$CF(z_1, z_2, \ldots, z_N) = \qquad \text{(Eq. 6''')}$$
$$(1-\lambda)\sum_{p=1}^{P} w_p f_p^2(z_1, z_2, \ldots, z_N) + \lambda \max_{1 \le p \le P} \frac{f_p(z_1, z_2, \ldots, z_N)}{CL_p}$$

where λ is a preset constant that specifies the trade-off between the optimization on RMS of the defect size and the optimization on the worst defect size. In particular, if λ=0, then this becomes Eq.4 and the RMS of the defect size is only minimized; while if λ=1, then this becomes Eq.5 and the worst defect size is only minimized; if 0<λ<1, then both are taken into consideration in the optimization. Such optimization can be solved using multiple methods. For example, the weighting in each iteration may be adjusted, similar to the one described previously. Alternatively, similar to minimizing the worst defect size from inequalities, the inequalities of Eq. 6' and 6" can be viewed as constraints of the design variables during solution of the quadratic programming problem. Then, the bounds on the worst defect size can be relaxed incrementally or increase the weight for the worst defect size incrementally, compute the cost function value for every achievable worst defect size, and choose the design variable values that minimize the total cost function as the initial point for the next step. By doing this iteratively, the minimization of this new cost function can be achieved.

Optimizing a lithographic projection apparatus can expand the process window. A larger process window provides more flexibility in process design and chip design. The process window can be defined as a set of focus and dose values for which the resist image are within a certain limit of the design target of the resist image. Note that all the methods discussed here may also be extended to a generalized process window definition that can be established by different or additional base parameters in addition to exposure dose and defocus. These may include, but are not limited to, optical settings such as NA, sigma, aberrations, polarization, or optical constants of the resist layer. For example, as described earlier, if the PW also consists of different mask bias, then the optimization includes the minimization of MEEF (Mask Error Enhancement Factor), which is defined as the ratio between the substrate EPE and the induced mask edge bias. The process window defined on focus and dose values only serve as an example in this disclosure. A method of maximizing the process window, according to an embodiment, is described below.

In a first step, starting from a known condition ($f_0$, $\varepsilon_0$) in the process window, wherein $f_0$ is a nominal focus and $\varepsilon_0$ is a nominal dose, minimizing one of the cost functions below in the vicinity ($f_0 \pm \Delta f$, $\varepsilon_0 \pm \Delta \varepsilon$):

$$CF(z_1, z_2, \ldots, z_N, f_0, \varepsilon_0) = \qquad \text{(Eq. 7)}$$
$$\max_{(f,\varepsilon)=(f_0 \pm \Delta f, \varepsilon_0 \pm \Delta \varepsilon)} \max_p |f_p(z_1, z_2, \ldots, z_N, f, \varepsilon)|$$

-continued
or $$CF(z_1, z_2, \ldots, z_N, f_0, \varepsilon_0) = \qquad \text{(Eq. 7')}$$
$$\sum_{(f,\varepsilon)=(f_0 \pm \Delta f, \varepsilon_0 \pm \Delta \varepsilon)} \sum_p w_p f_p^2(z_1, z_2, \ldots, z_N, f, \varepsilon)$$

or $$CF(z_1, z_2, \ldots, z_N, f_0, \varepsilon_0) = \qquad \text{(Eq. 7'')}$$
$$(1-\lambda) \sum_{(f,\varepsilon)=(f_0 \pm \Delta f, \varepsilon_0 \pm \Delta \varepsilon)} \sum_p w_p f_p^2(z_1, z_2, \ldots, z_N, f, \varepsilon) +$$
$$\lambda \max_{(f,\varepsilon)=(f_0 \pm \Delta f, \varepsilon_0 \pm \Delta \varepsilon)} \max_p |f_p(z_1, z_2, \ldots, z_N, f, \varepsilon)|$$

If the nominal focus $f_0$ and nominal dose $\varepsilon_0$ are allowed to shift, they can be optimized jointly with the design variables ($z_1, z_2, \ldots, z_N$). In the next step, ($f_0 \pm \Delta f$, $\varepsilon_0 \pm \Delta \varepsilon$) is accepted as part of the process window, if a set of values of ($z_1, z_2, \ldots, z_N, f, \varepsilon$) can be found such that the cost function is within a preset limit.

Alternatively, if the focus and dose are not allowed to shift, the design variables ($z_1, z_2, \ldots, z_N$) are optimized with the focus and dose fixed at the nominal focus $f_0$ and nominal dose $\varepsilon_0$. In an alternative embodiment, ($f_0 \pm \Delta f$, $\varepsilon_0 \pm \Delta \varepsilon$) is accepted as part of the process window, if a set of values of ($z_1, z_2, \ldots, z_N$) can be found such that the cost function is within a preset limit.

The methods described earlier in this disclosure can be used to minimize the respective cost functions of Eqs. 7, 7', or 7". If the design variables are characteristics of the projection optics, such as the Zernike coefficients, then minimizing the cost functions of Eqs. 7, 7', or 7" leads to process window maximization based on projection optics optimization, i.e., LO. If the design variables are characteristics of the source and patterning device in addition to those of the projection optics, then minimizing the cost function of Eqs. 7, 7', or 7" leads to process window maximizing based on SMLO, as illustrated in FIG. 13. If the design variables are characteristics of the source and patterning device and, then minimizing the cost functions of Eqs. 7, 7', or 7" leads to process window maximization based on SMO. The cost functions of Eqs. 7, 7', or 7" can also include at least one $f_p(z_1, z_2, \ldots, z_N)$ such as that in Eq. 7 or Eq. 8, that is a function of one or more stochastic effects such as the LWR or local CD variation of 2D features, and throughput.

Figure 15:
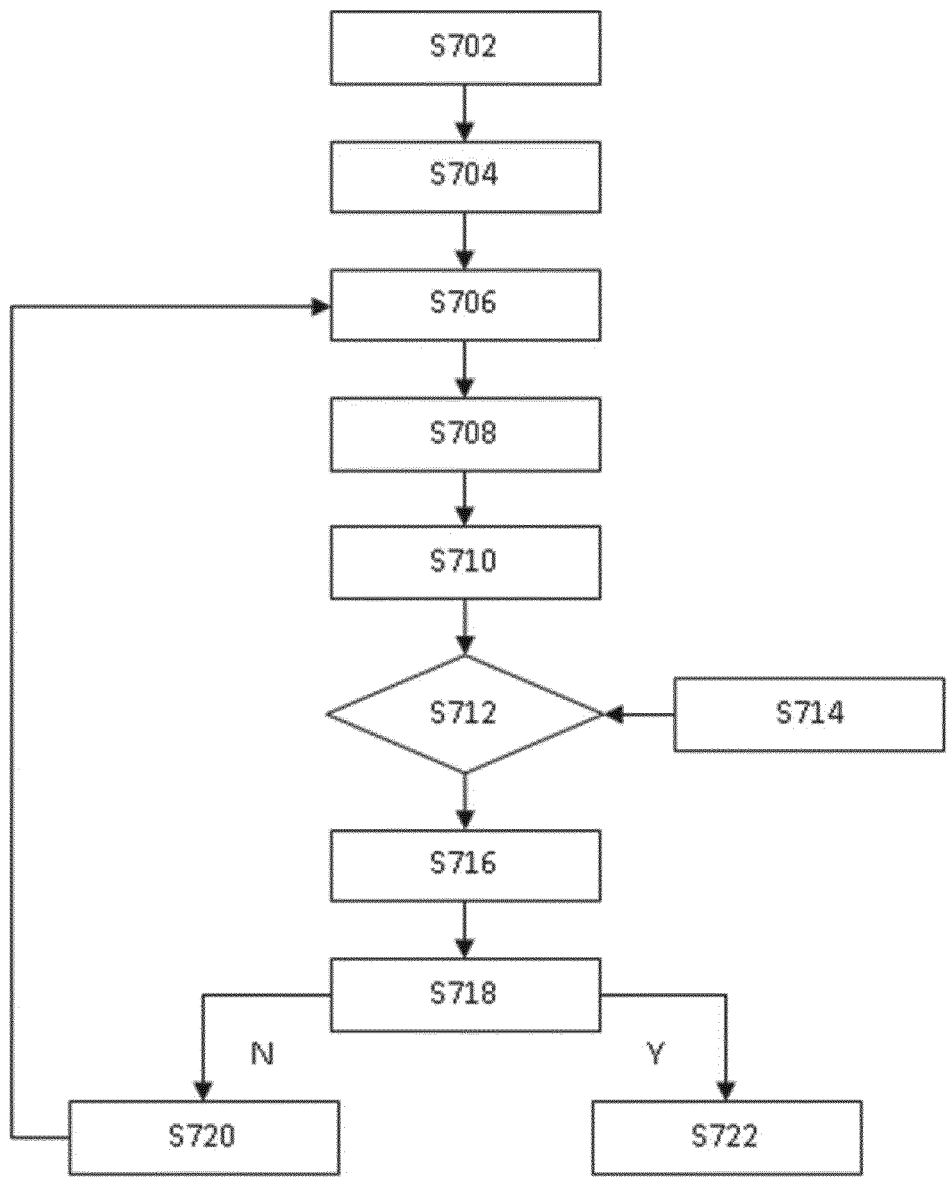

FIG. 15 shows one specific example of how a simultaneous SMLO process can use a Gauss Newton Algorithm for optimization. In step S702, starting values of design variables are identified. Tuning ranges for each variable may also be identified. In step S704, the cost function is defined using the design variables. In step S706 cost function is expanded around the starting values for all evaluation points in the design layout. In optional step S710, a full-chip simulation is executed to cover all critical patterns in a full-chip design layout. Desired lithographic response metric (such as CD or EPE) is obtained in step S714, and compared with predicted values of those quantities in step S712. In step S716, a process window is determined. Steps S718, S720, and S722 are similar to corresponding steps S514, S516 and S518, as described with respect to FIG. 14A. As mentioned before, the final output may be a wavefront aberration map in the pupil plane, optimized to produce the desired imaging performance. The final output may also be an optimized source map and/or an optimized design layout.

Figure 14B:
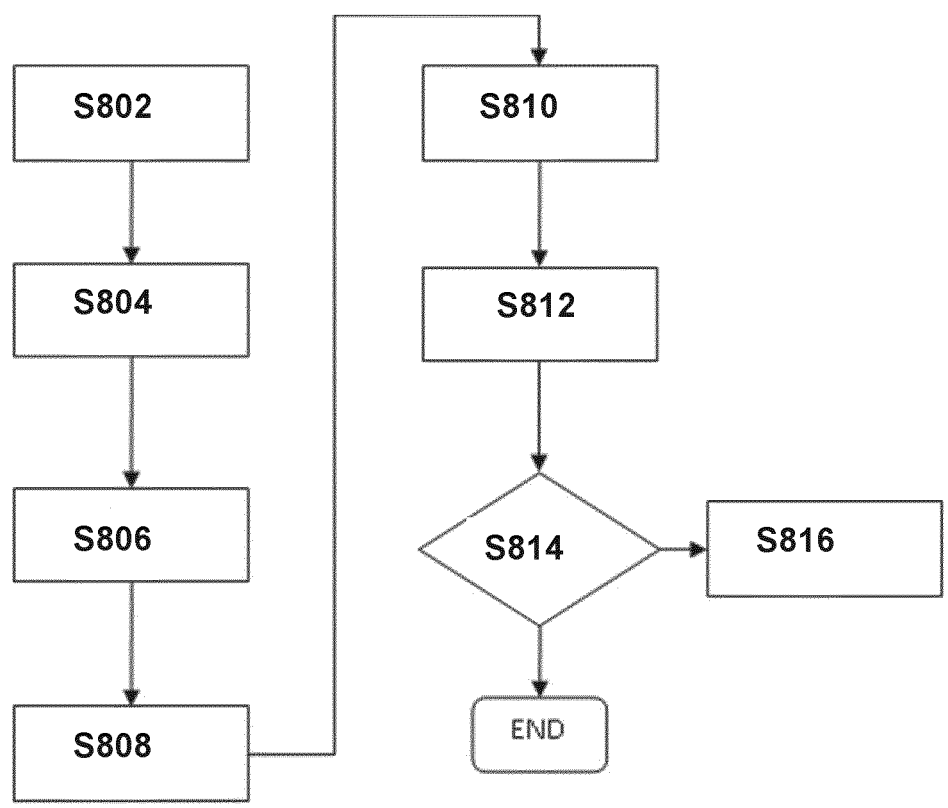

FIG. 14B shows an exemplary method to optimize the cost function where the design variables ($z_1, z_2, \ldots, z_N$) include design variables that may only assume discrete values.

The method starts by defining the pixel groups of the illumination source and the patterning device tiles of the patterning device (step S802). Generally, a pixel group or a patterning device tile may also be referred to as a division of a lithographic process component. In one exemplary approach, the illumination source is divided into 117 pixel groups, and 94 patterning device tiles are defined for the patterning device, substantially as described above, resulting in a total of 211 divisions.

In step S804, a lithographic model is selected as the basis for photolithographic simulation. Photolithographic simulations produce results that are used in calculations of photolithographic metrics, or responses. A particular photolithographic metric is defined to be the performance metric that is to be optimized (step S806). In step S808, the initial (pre-optimization) conditions for the illumination source and the patterning device are set up. Initial conditions include initial states for the pixel groups of the illumination source and the patterning device tiles of the patterning device such that references may be made to an initial illumination shape and an initial patterning device pattern. Initial conditions may also include mask bias, NA, and focus ramp range. Although steps S802, S804, S806, and S808 are depicted as sequential steps, it will be appreciated that in other embodiments of the invention, these steps may be performed in other sequences.

In step S810, the pixel groups and patterning device tiles are ranked. Pixel groups and patterning device tiles may be interleaved in the ranking. Various ways of ranking may be employed, including: sequentially (e.g., from pixel group 1 to pixel group 117 and from patterning device tile 1 to patterning device tile 94), randomly, according to the physical locations of the pixel groups and patterning device tiles (e.g., ranking pixel groups closer to the center of the illumination source higher), and according to how an alteration of the pixel group or patterning device tile affects the performance metric.

Once the pixel groups and patterning device tiles are ranked, the illumination source and patterning device are adjusted to improve the performance metric (step S812). In step S812, each of the pixel groups and patterning device tiles are analyzed, in order of ranking, to determine whether an alteration of the pixel group or patterning device tile will result in an improved performance metric. If it is determined that the performance metric will be improved, then the pixel group or patterning device tile is accordingly altered, and the resulting improved performance metric and modified illumination shape or modified patterning device pattern form the baseline for comparison for subsequent analyses of lower-ranked pixel groups and patterning device tiles. In other words, alterations that improve the performance metric are retained. As alterations to the states of pixel groups and patterning device tiles are made and retained, the initial illumination shape and initial patterning device pattern changes accordingly, so that a modified illumination shape and a modified patterning device pattern result from the optimization process in step S812.

In other approaches, patterning device polygon shape adjustments and pairwise polling of pixel groups and/or patterning device tiles are also performed within the optimization process of S812.

In an alternative embodiment the interleaved simultaneous optimization procedure may include to alter a pixel group of the illumination source and if an improvement of the performance metric is found, the dose is stepped up and down to look for further improvement. In a further alternative embodiment the stepping up and down of the dose or intensity may be replaced by a bias change of the patterning device pattern to look for further improvement in the simultaneous optimization procedure.

In step S814, a determination is made as to whether the performance metric has converged. The performance metric may be considered to have converged, for example, if little or no improvement to the performance metric has been witnessed in the last several iterations of steps S810 and S812. If the performance metric has not converged, then the steps of S810 and S812 are repeated in the next iteration, where the modified illumination shape and modified patterning device from the current iteration are used as the initial illumination shape and initial patterning device for the next iteration (step S816).

The optimization methods described above may be used to increase the throughput of the lithographic projection apparatus. For example, the cost function may include an $f_p(z_1, z_2, \ldots, z_N)$ that is a function of the exposure time. Optimization of such a cost function is preferably constrained or influenced by a measure of the stochastic effects or other metrics. Specifically, a computer-implemented method for increasing a throughput of a lithographic process may include optimizing a cost function that is a function of one or more stochastic effects of the lithographic process and a function of an exposure time of the substrate, in order to minimize the exposure time.

In one embodiment, the cost function includes at least one $f_p(z_1, z_2, \ldots, z_N)$ that is a function of one or more stochastic effects. The stochastic effects may include the failure of a feature, measurement data (e.g., SEPE) determined as in method of FIG. 3, $\sigma_{sepe}$ or LWR or local CD variation of 2D features. In one embodiment, the stochastic effects include stochastic variations of characteristics of a resist image. For example, such stochastic variations may include failure rate of a feature, a $\sigma_{sepe}$, line edge roughness (LER), line width roughness (LWR) and critical dimension uniformity (CDU). Including stochastic variations in the cost function allows finding values of design variables that minimize the stochastic variations, thereby reducing risk of defects due to stochastic effects.

Figure 16:
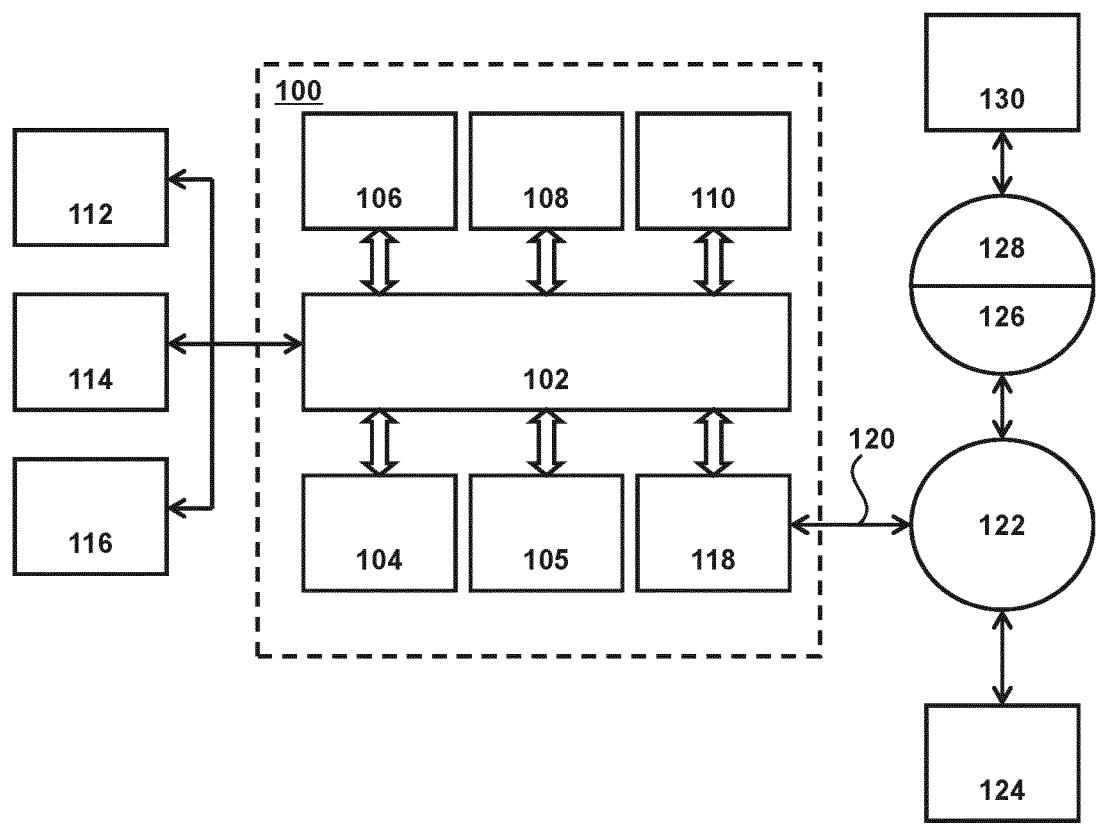
FIG. 16 is a block diagram of an example computer system, according to an embodiment.

FIG. 16 is a block diagram that illustrates a computer system 100 which can assist in implementing the optimization methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 17:
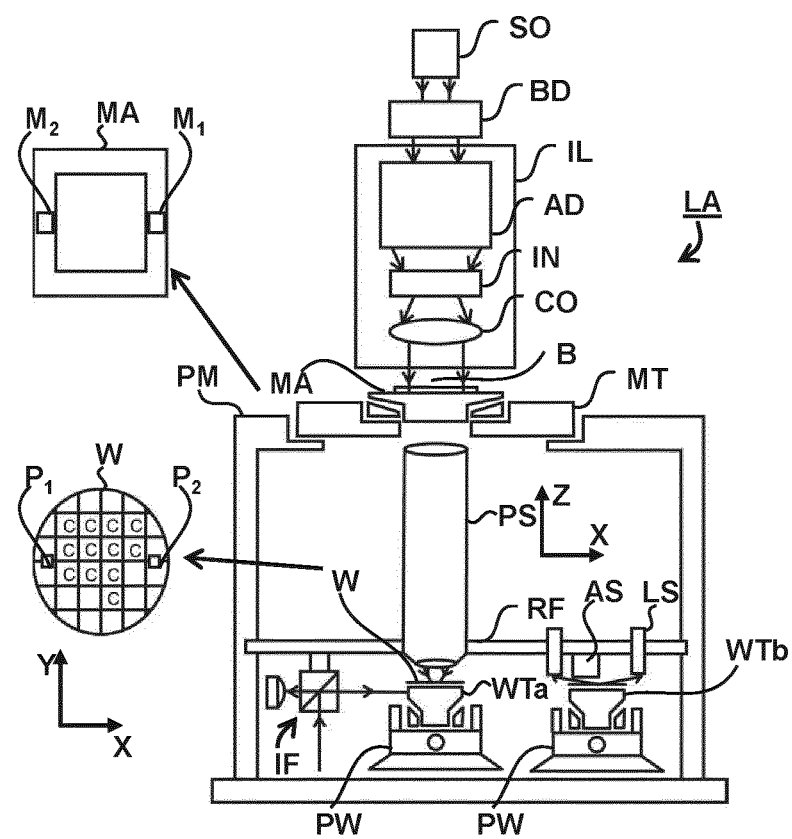
FIG. 17 is a schematic diagram of a lithographic projection apparatus, according to an embodiment.

FIG. 17 schematically depicts an exemplary lithographic projection apparatus whose illumination source could be optimized utilizing the methods described herein. The apparatus comprises:

- an illumination system IL, to condition a beam B of radiation. In this particular case, the illumination system also comprises a radiation source SO;
- a first object table (e.g., mask table) MT provided with a patterning device holder to hold a patterning device MA (e.g., a reticle), and connected to a first positioner to accurately position the patterning device with respect to item PS;
- a second object table (substrate table) WT provided with a substrate holder to hold a substrate W (e.g., a resist-coated silicon wafer), and connected to a second positioner to accurately position the substrate with respect to item PS;
- a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning device as an alternative to the use of a classic mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 17 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 17. However, in the case of a wafer stepper (as opposed to a step-and-scan tool) the patterning device table MT may just be connected to a short stroke actuator, or may be fixed.

The depicted tool can be used in two different modes:

In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

FIG. 18 schematically depicts another exemplary lithographic projection apparatus 1000 whose illumination source could be optimized utilizing the methods described herein.

The lithographic projection apparatus 1000 includes:
a source collector module SO
an illumination system (illuminator) IL configured to condition a radiation beam B (e.g. EUV radiation).
a support structure (e.g. a mask table) MT constructed to support a patterning device (e.g. a mask or a reticle) MA and connected to a first positioner PM configured to accurately position the patterning device;
a substrate table (e.g. a wafer table) WT constructed to hold a substrate (e.g. a resist coated wafer) W and connected to a second positioner PW configured to accurately position the substrate; and
a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective mask). It is to be noted that because most materials are absorptive within the EUV wavelength range, the mask may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 18, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 18, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 19:
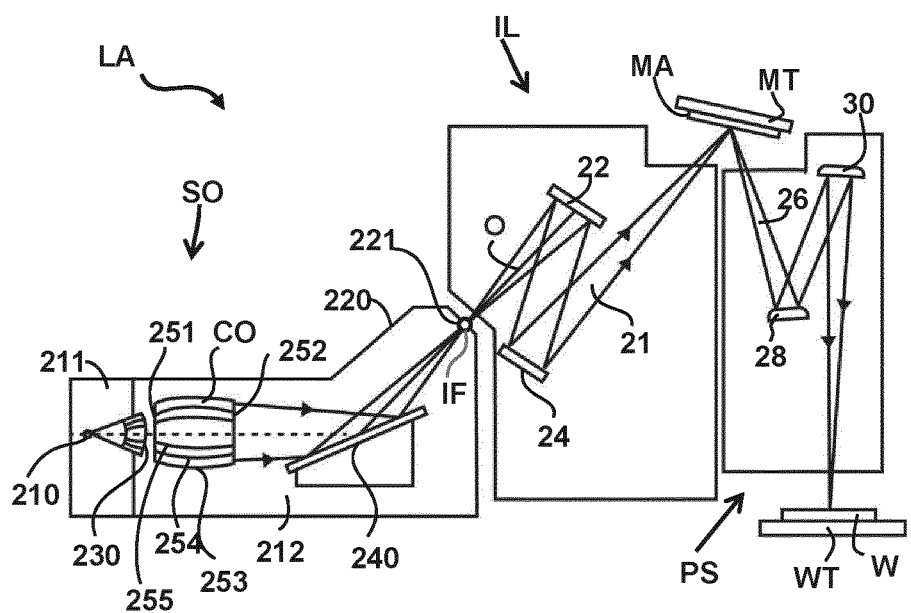
FIG. 19 is a more detailed view of the apparatus in FIG. 18, according to an embodiment.

FIG. 19 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 19.

Collector optic CO, as illustrated in FIG. 19, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is preferably used in combination with a discharge produced plasma source, often called a DPP source.

Figure 20:
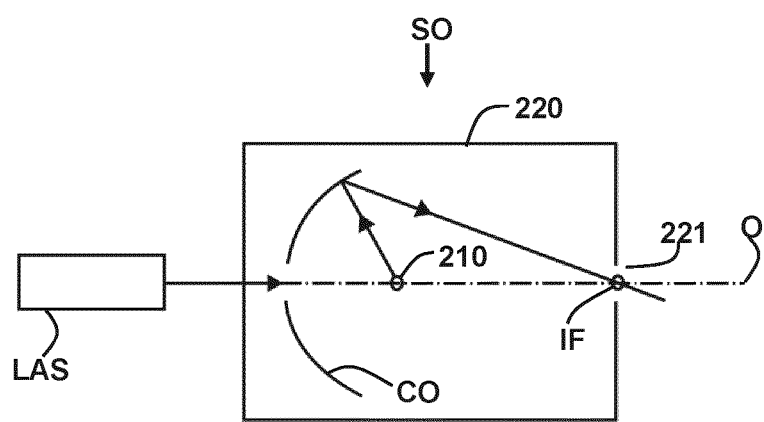
FIG. 20 is a more detailed view of the source collector module SO of the apparatus of FIGS. 18 and 19, according to an embodiment.

Alternatively, the source collector module SO may be part of an LPP radiation system as shown in FIG. 20. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

The embodiments may further be described using the following clauses:

1. A method for determining measurement data of a printed pattern on a substrate, the method comprising:

obtaining (i) a plurality of images of the substrate, each of the images comprising a printed pattern corresponding to a reference pattern, (ii) an averaged image of the plurality of images, and (iii) a composite contour of the printed patterns based on the averaged image;

aligning, via a processor, the composite contour of the averaged image with respect to a reference contour of the reference pattern;

extracting, via the processor, from the plurality of images the raw contours of the printed patterns within the images, the extracting being guided by the aligned composite contour;

determining, via the processor, a plurality of pattern measurements based on the plurality of contours, wherein pattern measurements are characteristics of the printed patterns; and determining, via the processor, the measurement data corresponding to the printed patterns based on the plurality of the pattern measurements.

2. The method of clause 1, wherein the aligning of the composite contour comprises:

overlapping the composite contour with the reference contour; and shifting the composite contour within a predefined range such that a difference between the composite contour and the reference contour is reduced.

3. The method of clause 2, wherein the shifting of the composite contour comprises:

shifting the composite contour with respect to a center of the predefined range such that a total contour-to-contour distance is reduced; and shifting the composite contour in a first direction to reduce a first contour-to-contour difference in the first direction, and/or shifting in a second direction to reduce a second contour-to-contour difference in the second direction.

4. The method of any of clauses 1-3, wherein the extracting of a contour from a given image of the plurality of images comprises;

identifying a starting point in the given image with respect to the composite contour;

finding a direction for contour edge searching; and determining an edge position of the contour in the given image of the plurality of images.

5. The method of any of clauses 1-4, wherein the image is a pixelated image.

6. The method of any of clauses 4-5, wherein the signal value comprises a pixel intensity of a pixel at a particular location of the image.

7. The method of any of clauses 1-6, the determining of the pattern measurement comprises:

defining a set of cut lines passing through a given contour of the plurality of the contour;

defining a plurality of measurement gauges along the given contour, wherein a measurement gauge is defined at an intersection of a cut line and the given contour; and determining the pattern measurement with respect to the measurement gauge.

8. The method of any of clauses 1-7, the pattern measurements are critical dimensions of the printed patterns, and/or an edge placement measurements of the printed patterns with respect to the reference pattern.

9. The method of clause 8, wherein a critical dimension of the critical dimensions is a distance between two measurement gauges along a horizontal cut line intersecting the given contour.

10. The method of clause 8, an edge placement measurement is an edge placement error determined at the measurement gauges along the given contour, wherein the edge placement error is a difference between the given contour and the reference contour at a given measurement gauge.

11. The method of any of clauses 1-10, wherein the determining of the measurement data comprises:

determining a first statistic corresponding to the printed patterns based on the plurality of measurements related to a particular die of the substrate; and/or determining a second statistic ($\sigma_{inter-die}$) corresponding to the printed patterns based on the plurality of measurements related to a particular field location across different dies of the substrate; and/or determining a third statistic associated with the printed patterns based on the plurality of measurements related to a particular feature within each image field of view (FOV); and/or determining a four statistic by combining the first statistic, the second, and third statistic.

12. The method of any of clauses 1-11, wherein the measurement data, the first statistic, and the second statistic are associated with process variations, and the third static is associated with stochastic variations in measurements of the printed patterns 13. The method of clause 12, wherein the first statistic is an intra-die variation in measurements of the printed patterns of the substrate.

14. The method of clause 12, wherein the second statistic is an inter-die variation in measurements of the printed patterns of the substrate.

15. The method of clause 12, wherein the third statistic is a stochastic variation in measurements of the printed patterns of the substrate.

16. The method of any of clauses 1-15, wherein obtaining the averaged image comprises:

aligning the printed patterns of the plurality of images with respect to each other;

identifying locations along the printed patterns of the plurality of images having a relatively high signal values and aligning the identified locations; and determining the average image by computing average values of the signal values of the aligned plurality of images.

17. The method of any of clauses 1-16, wherein the aligning the printed patterns of the plurality of images comprises:

shifting one or more images of the plurality of images to align corresponding printed patterns of the one or more images to the reference pattern such that a difference between the printed patterns of the plurality of images is reduced.

18. The method of any of clauses 1-17, wherein obtaining the composite contour comprises:
aligning the printed patterns of the average image with the reference pattern such that a difference between the patterns is reduced; and
extracting the composite contour from the average image based on a relatively high signal-to-noise ratio values at locations around the reference pattern.

19. The method of any of clauses 1-18, wherein the reference pattern is a design pattern or a simulated pattern.

20. The method of any of clauses 1-19, wherein the plurality of images are scanning electron microscope images.

21. An apparatus configured to extract a contour from a metrology image, the apparatus comprising a processor configured to:
obtain (i) the metrology image of a substrate having a printed pattern, (ii) an averaged image of the printed pattern, and (ii) a measurement statistic corresponding to the printed pattern based on the averaged image;
extract, based on the measurement statistic and the averaged image, a contour of the printed pattern from the metrology image.

22. The apparatus of clause 21, wherein extracting of the contour comprises:
aligning the averaged image with the metrology image; and
identifying locations in the metrology image around the averaged image that have signal values within the measurement statistic; and
defining the contour based on the relatively high signal values around the identified locations.

23. The apparatus of any of clauses 21-22, wherein the processor is further configured to:
determine, based on the extracted contour, a pattern measurement.

24. The apparatus of clause 23, wherein the pattern measurement is a critical dimension of the printed pattern, and/or an edge placement of the printed pattern with respect to the reference pattern.

25. The apparatus of any of clauses 21-24, wherein the measurement statistic is stochastic variation in measurements of the printed pattern across the substrate.

26. The apparatus of any of clauses 21-25, wherein the metrology image is scanning electron microscope image.

27. A computer program product comprising a non-transitory computer readable medium having instructions recorded thereon, the instructions when executed by a computer implementing the method of any of the clauses 1-26.

What is claimed is:

1. A method comprising:
obtaining (i) a plurality of images of a substrate, each of the images comprising a printed pattern corresponding to a reference pattern, (ii) an averaged image of the plurality of images, and (iii) a composite contour of printed patterns based on the averaged image;
aligning, via a hardware processor system, the composite contour of the averaged image with respect to a reference contour of the reference pattern;
extracting, via the processor system, from the plurality of images a plurality of contours of the printed patterns within the images to retain at least some stochastic variation in the plurality of images, the extracting being guided by the aligned composite contour;
determining, via the processor system, a plurality of pattern measurements based on the plurality of contours, wherein pattern measurements are characteristics of the printed patterns; and
determining, via the processor system, measurement data corresponding to the printed patterns based on the plurality of the pattern measurements.

2. The method of claim 1, wherein the aligning the composite contour comprises:
overlapping the composite contour with the reference contour; and
shifting the composite contour within a predefined range such that a difference between the composite contour and the reference contour is reduced.

3. The method of claim 2, wherein the shifting of the composite contour comprises:
shifting the composite contour with respect to a center of the predefined range such that a total contour-to-contour distance is reduced; and
shifting the composite contour in a first direction to reduce a first contour-to-contour difference in the first direction, and/or shifting the composite contour in a second direction to reduce a second contour-to-contour difference in the second direction.

4. The method of claim 1, wherein the extracting comprises extracting a contour from a given image of the plurality of images, wherein the extracting the contour from a given image comprises:
identifying a starting point in the given image with respect to the composite contour;
finding a direction for contour edge searching; and
determining an edge position of the contour in the given image of the plurality of images.

5. The method of claim 1, wherein the determining the plurality of pattern measurements comprises:
defining a set of cut lines passing through a given contour of the plurality of contours;
defining a plurality of measurement gauges along the given contour, wherein a measurement gauge is defined at an intersection of a cut line and the given contour; and
determining the pattern measurements with respect to the measurement gauges.

6. The method of claim 1, wherein the pattern measurements are critical dimensions of the printed patterns, and/or edge placement measurements of the printed patterns with respect to the reference pattern.

7. The method of claim 6, wherein the pattern measurements are edge placement measurements of the printed patterns with respect to the reference pattern and an edge placement measurement is an edge placement error determined at a measurement gauge along a given contour, wherein the edge placement error is a difference between the given contour and the reference contour at a given measurement gauge.

8. The method of claim 1, wherein the determining the measurement data comprises one or more selected from:
determining a first statistic corresponding to the printed patterns based on the plurality of pattern measurements related to a particular die of the substrate;
determining a second statistic corresponding to the printed patterns based on the plurality of pattern measurements related to a particular field location across different dies of the substrate;
determining a third statistic associated with the printed patterns based on the plurality of pattern measurements related to a particular feature within each image field of view; and/or
determining a fourth statistic by combining the first statistic, the second, and third statistic.

9. The method of claim 8, wherein the measurement data, the first statistic, and the second statistic are associated with process variations, and the third statistic is associated with stochastic variations in measurements of the printed patterns.

10. The method of claim 9, wherein the first statistic is an intra-die variation in measurements of the printed patterns of the substrate, wherein the second statistic is an inter-die variation in measurements of the printed patterns of the substrate, and wherein the third statistic is a stochastic variation in measurements of the printed patterns of the substrate.

11. The method of claim 1, further comprising aligning the printed patterns of the plurality of images, the aligning the printed patterns comprising shifting one or more images of the plurality of images to align corresponding printed patterns of the one or more images to the reference pattern such that a difference between the printed patterns of the plurality of images is reduced.

12. The method of claim 1, wherein the obtaining the composite contour comprises:
aligning the printed patterns of the average image with the reference pattern such that a difference between the patterns is reduced; and
extracting the composite contour from the average image based on a signal-to-noise ratio value at locations around the reference pattern.

13. The method of claim 1, wherein the reference pattern is a design pattern or a simulated pattern, and wherein the plurality of images are scanning electron microscope images.

14. The method of claim 1, wherein the measurement data is stochastic variation in measurements of the printed pattern across the substrate.

15. A computer program product comprising a non-transitory computer readable medium having instructions therein, the instructions configured to cause a processor system to at least:
obtain (i) a plurality of images of a substrate, each of the images comprising a printed pattern corresponding to a reference pattern, (ii) an averaged image of the plurality of images, and (iii) a composite contour of printed patterns based on the averaged image;
align the composite contour of the averaged image with respect to a reference contour of the reference pattern;
extract from the plurality of images a plurality of contours of the printed patterns within the images to retain at least some stochastic variation in the plurality of images, the extraction guided by the aligned composite contour;
determine a plurality of pattern measurements based on the plurality of contours, wherein pattern measurements are characteristics of the printed patterns; and
determine the measurement data corresponding to the printed patterns based on the plurality of the pattern measurements.

16. The computer program product of claim 15, wherein the instructions configured to cause the processor system to align the composite contour are further configured to cause the processor system to:
overlap the composite contour with the reference contour; and
shift the composite contour within a predefined range such that a difference between the composite contour and the reference contour is reduced.

17. The computer program product of claim 15, wherein the instructions configured to cause the processor system to extract the plurality of contours are further configured to cause the processor system to extract a contour from a given image of the plurality of images, wherein the extraction of the contour from a given image comprises:
identification of a starting point in the given image with respect to the composite contour;
finding of a direction for contour edge searching; and
determination of an edge position of the contour in the given image of the plurality of images.

18. The computer program product of claim 15, wherein the instructions configured to cause the processor system to determine the plurality of pattern measurements are further configured to cause the processor system to:
define a set of cut lines passing through a given contour of the plurality of contours;
define a plurality of measurement gauges along the given contour, wherein a measurement gauge is defined at an intersection of a cut line and the given contour; and
determine the pattern measurements with respect to the measurement gauges.

19. The computer program product of claim 15, wherein the instructions configured to cause the processor system to determine the measurement data are further configured to cause the processor system to one or more selected from:
determine a first statistic corresponding to the printed patterns based on the plurality of pattern measurements related to a particular die of the substrate;
determine a second statistic corresponding to the printed patterns based on the plurality of pattern measurements related to a particular field location across different dies of the substrate;
determine a third statistic associated with the printed patterns based on the plurality of pattern measurements related to a particular feature within each image field of view; and/or
determine a fourth statistic by combining the first statistic, the second, and third statistic.

20. The computer program product of claim 15, wherein the instructions are further configured to cause the processor system to align the printed patterns of the plurality of images, the alignment of the printed patterns comprising shifting of one or more images of the plurality of images to align corresponding printed patterns of the one or more images to the reference pattern such that a difference between the printed patterns of the plurality of images is reduced.

* * * * *